(12) United States Patent
Bouche et al.

(10) Patent No.: US 10,262,941 B2
(45) Date of Patent: Apr. 16, 2019

(54) DEVICES AND METHODS FOR FORMING CROSS COUPLED CONTACTS

(71) Applicant: GLOBALFOUNDRIES Inc., Grand Cayman (KY)

(72) Inventors: Guillaume Bouche, Albany, NY (US); Jason Eugene Stephens, Menands, NY (US); Tuhin Guha Neogi, Clifton Park, NY (US); Kai Sun, Clifton Park, NY (US); Deniz Elizabeth Civay, Clifton Park, NY (US); David Charles Pritchard, Glenville, NY (US); Andy Wei, Kanata (CA)

(73) Assignee: GLOBALFOUNDRIES Inc., Grand Cayman (KY)

( * ) Notice: Subject to any disclaimer, the term of this patent is extended or adjusted under 35 U.S.C. 154(b) by 114 days.

(21) Appl. No.: 15/136,384

(22) Filed: Apr. 22, 2016

(65) Prior Publication Data
US 2017/0309560 A1  Oct. 26, 2017

(51) Int. Cl.
| | |
|---|---|
| *H01L 21/33* | (2006.01) |
| *H01L 23/528* | (2006.01) |
| *H01L 21/033* | (2006.01) |
| *H01L 21/311* | (2006.01) |
| *H01L 21/3213* | (2006.01) |
| *H01L 21/762* | (2006.01) |
| *H01L 21/768* | (2006.01) |
| *H01L 23/522* | (2006.01) |

(52) U.S. Cl.
CPC ........ *H01L 23/528* (2013.01); *H01L 21/0337* (2013.01); *H01L 21/31111* (2013.01); *H01L 21/31144* (2013.01); *H01L 21/32133* (2013.01); *H01L 21/762* (2013.01); *H01L 21/7684* (2013.01); *H01L 21/76802* (2013.01); *H01L 21/76841* (2013.01); *H01L 21/76877* (2013.01); *H01L 23/5226* (2013.01)

(58) Field of Classification Search
CPC ........ H01L 21/31111; H01L 21/76802; H01L 21/762; H01L 21/31144; H01L 21/0337; H01L 21/32133; H01L 21/76841; H01L 21/76877; H01L 21/7684; H01L 23/528; H01L 23/5226
See application file for complete search history.

(56) References Cited

U.S. PATENT DOCUMENTS

| | | | |
|---|---|---|---|
| 9,530,689 B2 | 12/2016 | Civay et al. | |
| 9,646,865 B1 * | 5/2017 | Zhang | G03F 9/7015 |
| 2006/0046201 A1 | 3/2006 | Sandhu et al. | |
| 2006/0046422 A1 | 3/2006 | Tran et al. | |
| 2006/0211260 A1 | 9/2006 | Tran et al. | |

(Continued)

*Primary Examiner* — (Vikki) Hoa B Trinh
(74) *Attorney, Agent, or Firm* — Heslin Rothenberg Farley & Mesiti P.C.; Jacquelyn A. Graff

(57) ABSTRACT

Semiconductor devices and methods of fabricating the semiconductor devices with cross coupled contacts using patterning for cross couple pick-up are disclosed. One method includes, for instance: obtaining an intermediate semiconductor device; performing a first lithography to pattern a first shape; performing a second lithography to pattern a second shape overlapping a portion of the first shape; processing the first shape and the second shape to form an isolation region at the overlap; and forming four regions separated by the isolation region. An intermediate semiconductor device is also disclosed.

13 Claims, 33 Drawing Sheets

(56) References Cited

U.S. PATENT DOCUMENTS

| | | |
|---|---|---|
| 2011/0076845 A1 | 3/2011 | Tsai et al. |
| 2013/0224936 A1 | 8/2013 | Lee et al. |
| 2014/0284813 A1 | 9/2014 | Greco et al. |
| 2015/0102392 A1 | 4/2015 | Yu et al. |
| 2015/0339422 A1 | 11/2015 | Greco et al. |
| 2016/0163837 A1 | 6/2016 | Wu et al. |
| 2016/0268257 A1 | 9/2016 | Lim et al. |
| 2016/0300754 A1 | 10/2016 | Civay et al. |
| 2017/0124243 A1* | 5/2017 | Chang ................. G06F 17/5072 |

* cited by examiner

US 10,262,941 B2

1

DEVICES AND METHODS FOR FORMING CROSS COUPLED CONTACTS

FIELD OF THE INVENTION

The present invention relates to semiconductor devices, methods of fabricating semiconductor devices, and methods of patterning close-by shapes with limited number of lithography exposure steps, and more particularly, to methods and devices for source and drain patterning for cross couple pick-up.

BACKGROUND OF THE INVENTION

As semiconductor devices continue to decrease in size, the size of the devices continue to decrease. With smaller devices the components need to decrease in size and be placed closer together. In order to place contacts closer together, multi-patterning with multiple masks is performed. With multi-patterning and multiple masks the cost of manufacturing a semiconductor device greatly increases. In addition, during the multi-patterning processes the resultant contacts may end up not being sufficiently electrically separated resulting in shorts and an increase in defectivity. Thus, new devices and methods for decreasing the cost for performing multi-patterning while maintaining the electrical separation between contacts is needed.

SUMMARY OF THE INVENTION

The shortcomings of the prior art are overcome and additional advantages are provided through the provision, in one aspect, a method includes, for instance: obtaining an intermediate semiconductor device; performing a first lithography to pattern a first shape; performing a second lithography to pattern a second shape overlapping a portion of the first shape; processing the first shape and the second shape to form an isolation region at the overlap; and forming four regions separated by the isolation region.

In another aspect, a method includes, for instance: obtaining an intermediate semiconductor device; performing a first lithography using a first mask to form at least one first via opening; performing a second lithography using a second mask to form at least one second via opening, wherein the at least one second via opening overlaps the at least one first via opening; and forming at least four contacts from the at least one first via opening and the at least one second via opening.

In yet another aspect, an intermediate semiconductor device is provided which includes, for instance: a substrate; an interlayer dielectric layer deposition on the substrate; a hard mask bi-layer on the interlayer dielectric layer; a polysilicon layer on the hard mask bi-layer; an etch stop layer on the polysilicon layer; an oxide layer on the etch stop layer; at least one first opening extending from a top surface of the intermediate semiconductor device through the oxide layer; at least one second opening extending from the top surface of the intermediate semiconductor device through the oxide layer, wherein the at least one first opening overlaps the at least one second opening; and a self-aligned block positioned where the at least one first opening overlaps the at least one second opening.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices formed using less masks and devices with larger critical dimensions and slack for overlay.

Figure 1A:
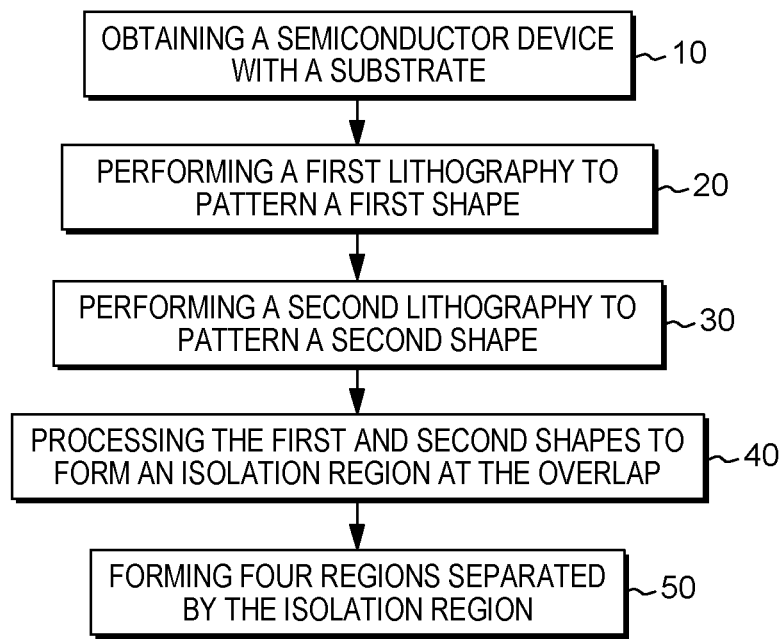
FIG. 1A depicts one embodiment of a method for a patterning process which may be used during semiconductor processing, in accordance with one or more aspects of the present invention.

In one aspect, as shown in FIG. 1A, a patterning process which may be used during semiconductor processing is shown. The patterning process in accordance with one or more aspects of the present invention may include, for instance: obtaining a semiconductor device with a substrate 10; performing a first lithography to pattern a first shape 20; performing a second lithography to pattern a second shape overlapping a portion of the first shape 30; processing the first shape and the second shape to form an isolation region at the overlap 40; and forming four regions separated by the isolation region 50. The patterning process may be, for example, a Boolean operation. The Boolean operation affects two intersecting shapes each printed by a separate lithographic process. The two intersecting shapes may be processed to form four shapes or branches each of which is isolated from the other shape or branch. Each shape or branch may be formed to be electrically independent. The point of intersection between the two shapes will result in no pattern to electrically separate each of the shapes or branches.

Figure 1B:
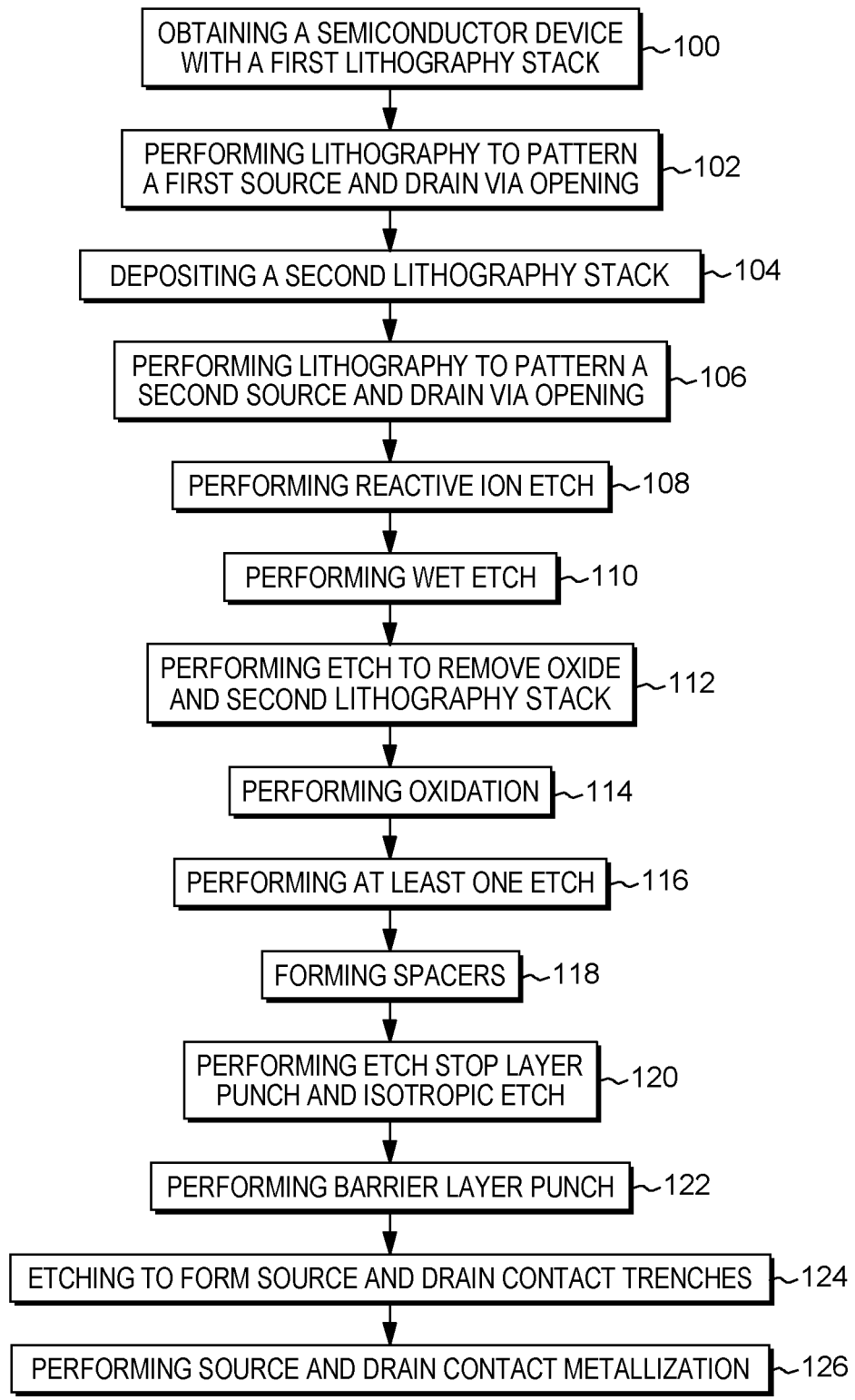
FIG. 1B depicts one embodiment of a methods for source and drain patterning for cross couple pick-up, in accordance with one or more aspects of the present invention.

In another aspect, in one embodiment as shown in FIG. 1B, the semiconductor device formation process in accordance with one or more aspects of the present invention may include, for instance: obtaining a semiconductor device with a first lithography stack formed over the substrate 100; performing lithography to pattern first source/drain via openings 102; depositing a second photoresist stack 104; performing another lithography to pattern second source/drain via openings 106; performing a reactive ion etch 108; performing a wet etch 110; performing an etch to remove the oxide and second photoresist stack 112; performing an oxidation 114; performing at least one etch 116; forming spacers 118; performing an etch stop layer punch and isotropic etch 120; performing a barrier layer punch 122; etching to form source/drain contact trenches 124; and performing source/drain contact metallization 126.

FIGS. 2-36 depict, by way of example only, a detailed embodiment of a portion of a semiconductor device formation process of FIGS. 1A-1B and an intermediate semiconductor device 200, in accordance with one or more aspects of the present invention. Note again that these figures are not drawn to scale in order to facilitate understanding of the invention, and that the same reference numerals used throughout different figures designate the same or similar elements.

Figure 2:
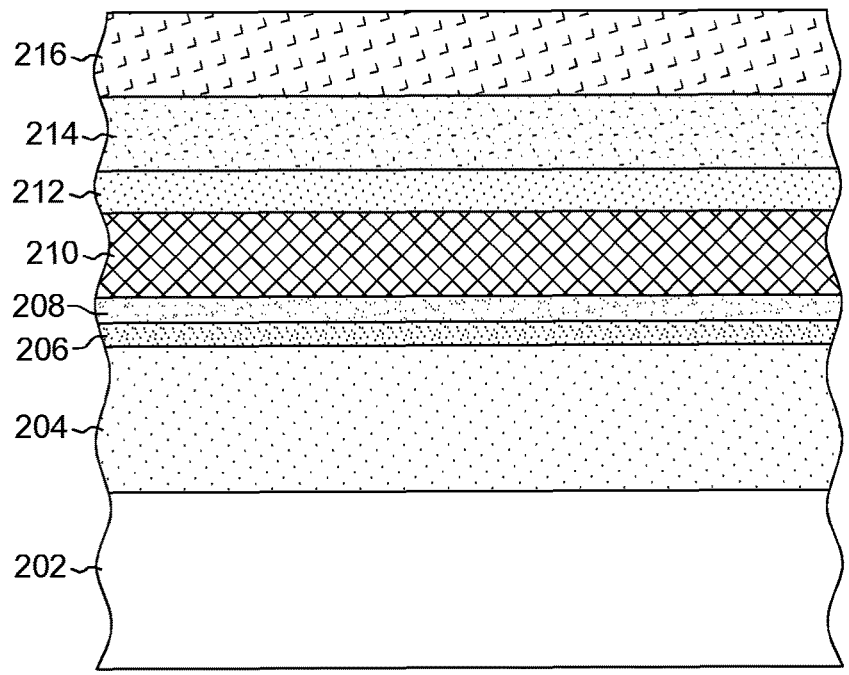
FIG. 2 depicts a cross-sectional elevation view of one embodiment of an integrated circuit with at least one lithography stack over the intermediate semiconductor device, in accordance with one or more aspects of the present invention.

One detailed embodiment of a portion of the semiconductor device formation process of FIGS. 1A-1B is depicted, by way of example only, in FIGS. 2-36. FIG. 2 shows a portion of a semiconductor device 200 obtained during the fabrication process. The device 200 may include, for example, a substrate 202. The substrate 202 may in some embodiments have or be a substantially crystalline substrate material (i.e., bulk silicon), whereas in other embodiments, the substrate 202 may be formed on the basis of a silicon-on-insulator (SOI) architecture or any known substrate, such as, glass, gallium nitride (GaN), gallium arsenide (AsGa), silicon carbide (SiC) or the like.

The device 200 may be processed through initial processing steps in accordance with the design of the device 200 being fabricated. For example, the device 200 may include an interlayer dielectric (ILD) layer 204 deposited on the substrate 202. The ILD layer 204 may be, for example, carbon doped oxide dielectric, such as, SiCOH and the like, or a combination of these commonly used dielectric materials. The device 200 may also include a hard mask bi-layer 206, 208, which may include a first hard mask layer 206 and a second hard mask layer 208. The first hard mask layer 206 may be, for example, a silicon nitride (SiN), silicon oxynitride (SiON), titanium dioxide (TiO$_2$), aluminum nitride (AlN), titanium nitride (TiN), amorphous silicon (Si) layer or the like. The second hard mask layer 208 may be, for example, a TiN, SiN, SiON, TiO$_2$, AlN layer or the like. The device 200 may also include a polysilicon layer 210, for example, an amorphous silicon layer. The device 200 may further include an etch stop layer 212, for example, a SiN or AlN layer. An oxide layer 214 may be deposited over the etch stop layer 212. The oxide layer 214 may be, for example, a silicon dioxide (SiO$_2$) layer. Finally, a first lithography stack 216 may be deposited over the oxide layer 214. The first lithography stack 216 may be any known lithography stack, for example, the first lithograph stack 216 may include a spin-on-hardmask, a dielectric layer, a bottom anti-reflection coating (BARC) layer and a photoresist layer.

The spin-on-hardmask may be, for example, an amorphous carbon film. The dielectric layer may be, for example, a SiON film.

Figure 3:
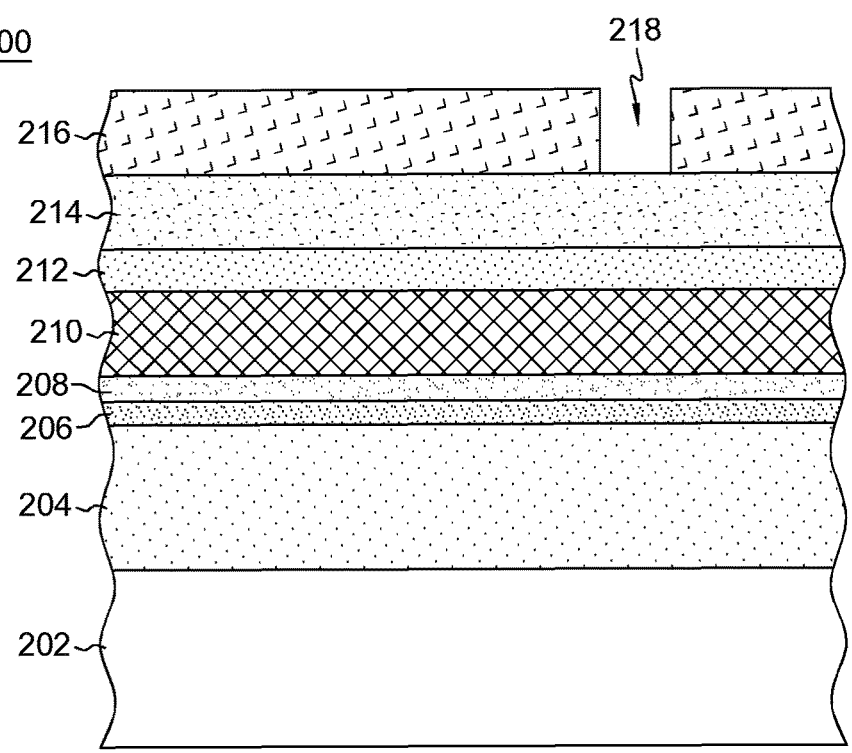
FIG. 3 depicts the cross-sectional elevation view of the semiconductor device of FIG. 2 after performing lithography to pattern at least one first source/drain via, in accordance with one or more aspects of the present invention.
Figure 4:
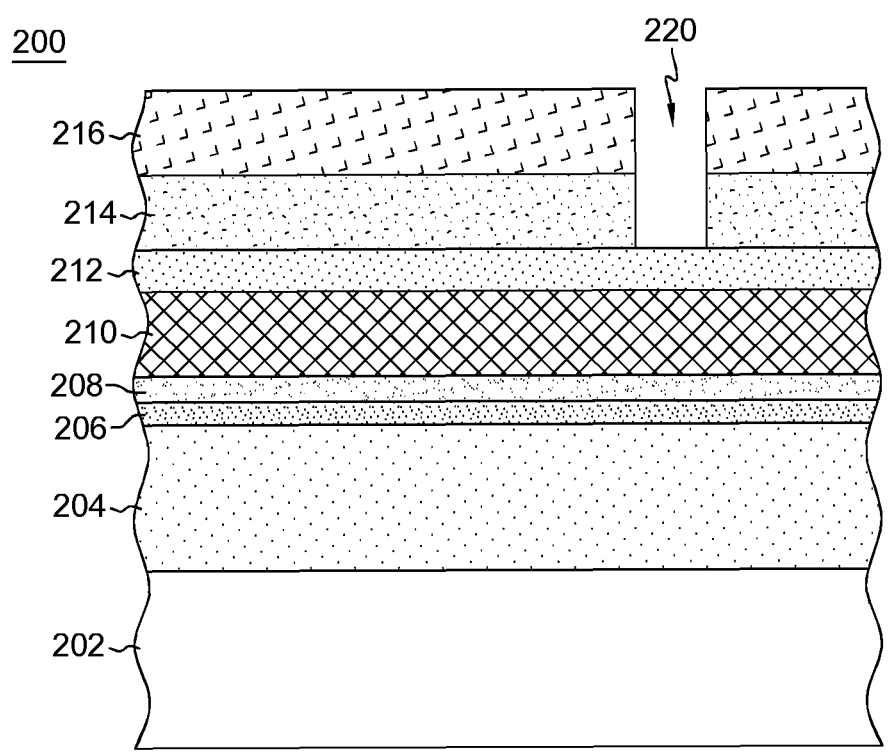
FIG. 4 depicts the cross-sectional elevation view of the semiconductor device of FIG. 3 after etching an oxide layer of the intermediate semiconductor device, in accordance with one or more aspects of the present invention.
Figure 5:
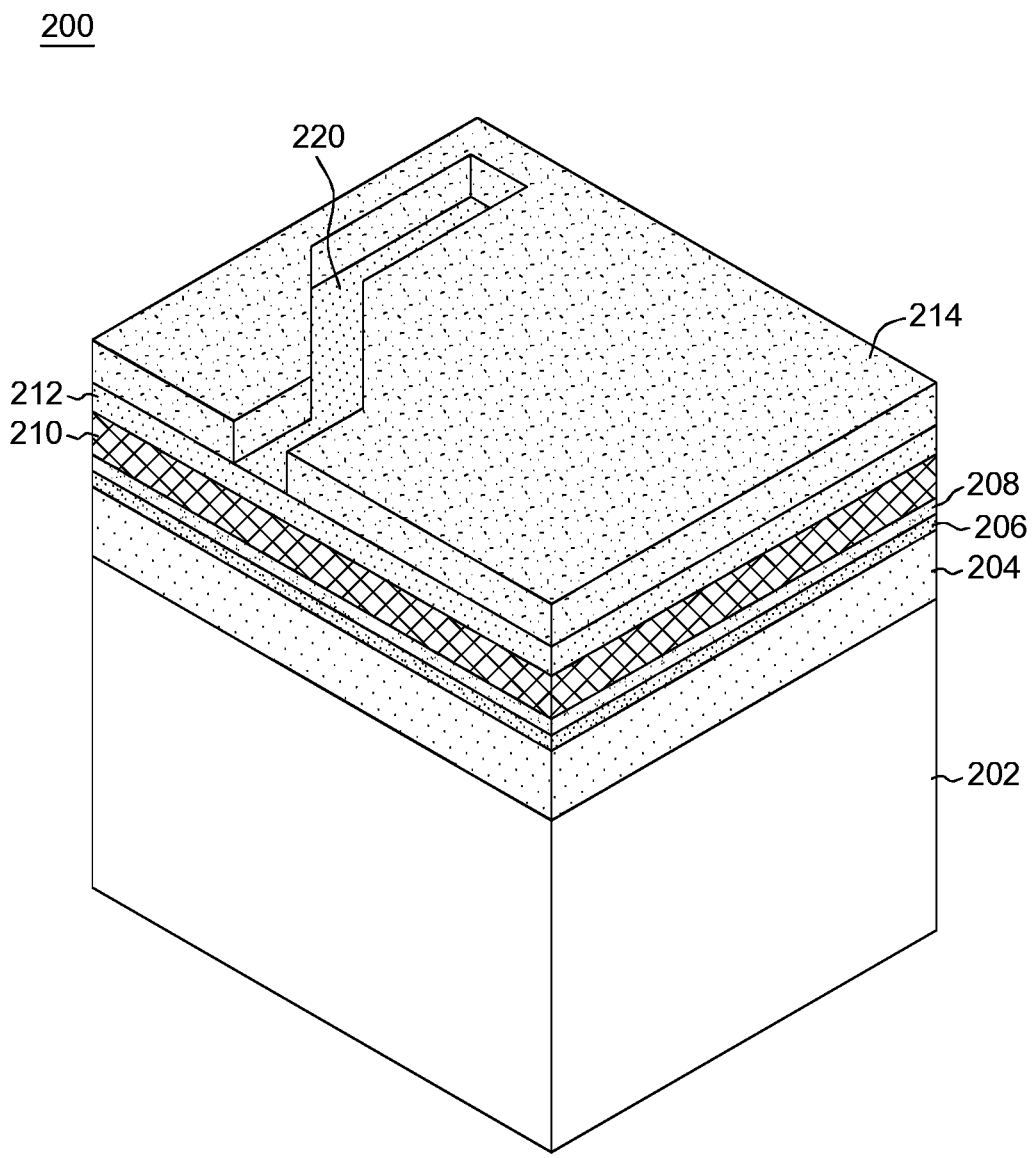
FIG. 5 depicts a three dimensional view of the semiconductor device of FIG. 4 after stripping the first lithography stack, in accordance with one or more aspects of the present invention.
Figure 6:
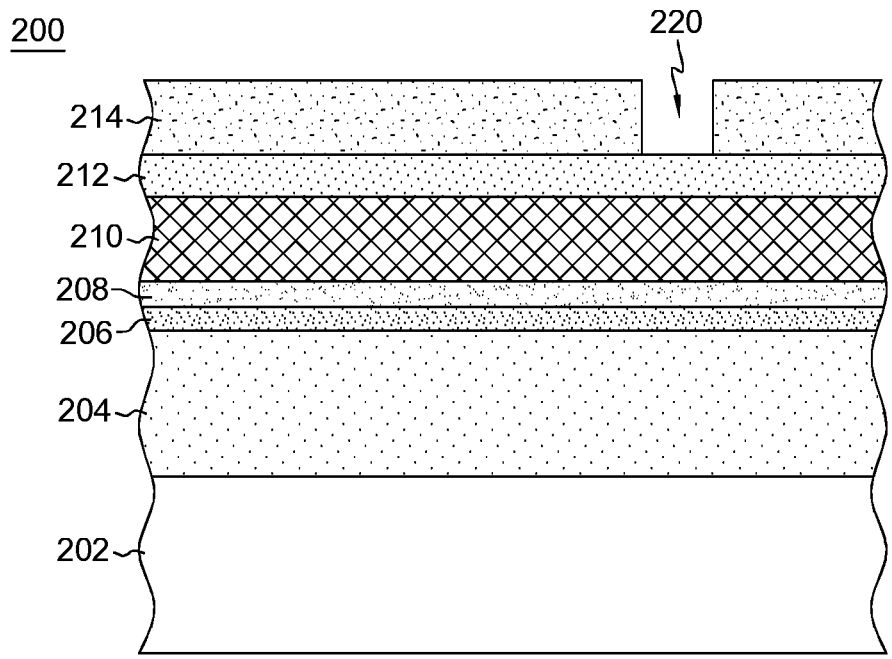
FIG. 6 depicts the cross-sectional elevation view of the semiconductor device of FIG. 5, in accordance with one or more aspects of the present invention.
Figure 7:
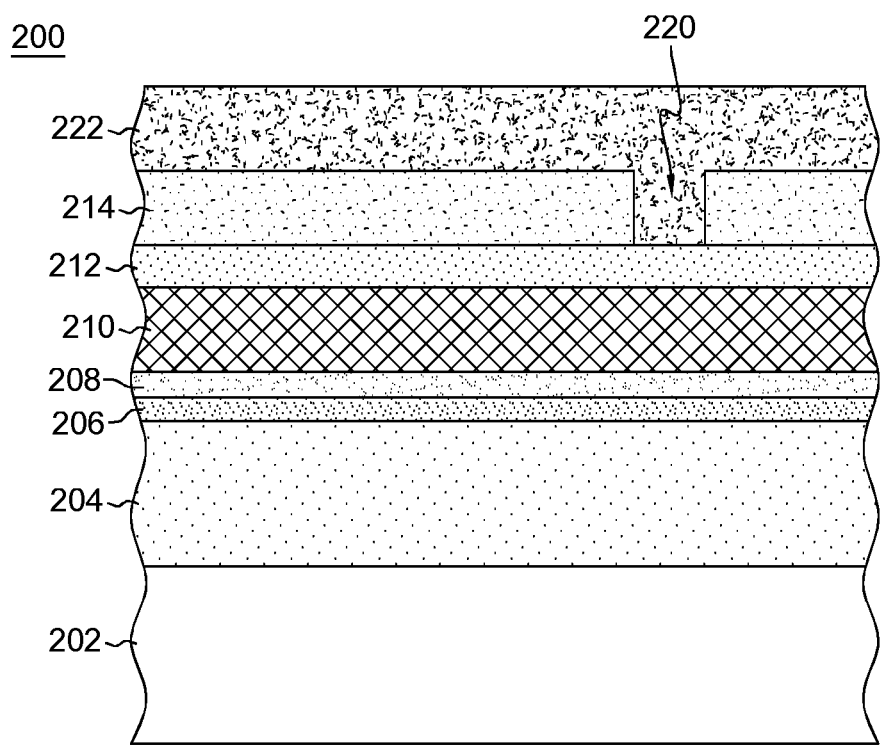
FIG. 7 depicts the cross-sectional elevation view of the semiconductor device of FIG. 6 after depositing a second lithography stack, in accordance with one or more aspects of the present invention.

Next, as shown in FIG. 3, lithography may be performed using a first mask to pattern the first lithography stack 216 to form at least one first source/drain via pattern 218. An etch may then be performed to the device 200 to etch the oxide layer 214 below the at least one first source/drain via pattern 218 to form at least one first source/drain via opening 220, as shown in FIG. 4. Once the etching is complete, the first lithography stack 216 may be stripped, as shown in FIGS. 5 and 6. Next, as shown in FIG. 7, a second lithography stack 222 may be deposited over the device 200. The second lithography stack 222 may be any known lithography stack, for example, the second lithography stack 222 may include a gapfill and self-planarizing spin-on-hardmask, a dielectric layer, a bottom anti-reflection coating (BARC) layer and a photoresist layer. The first layer of the second lithography stack 222 may fill the at least one first via opening 220.

Figure 8:
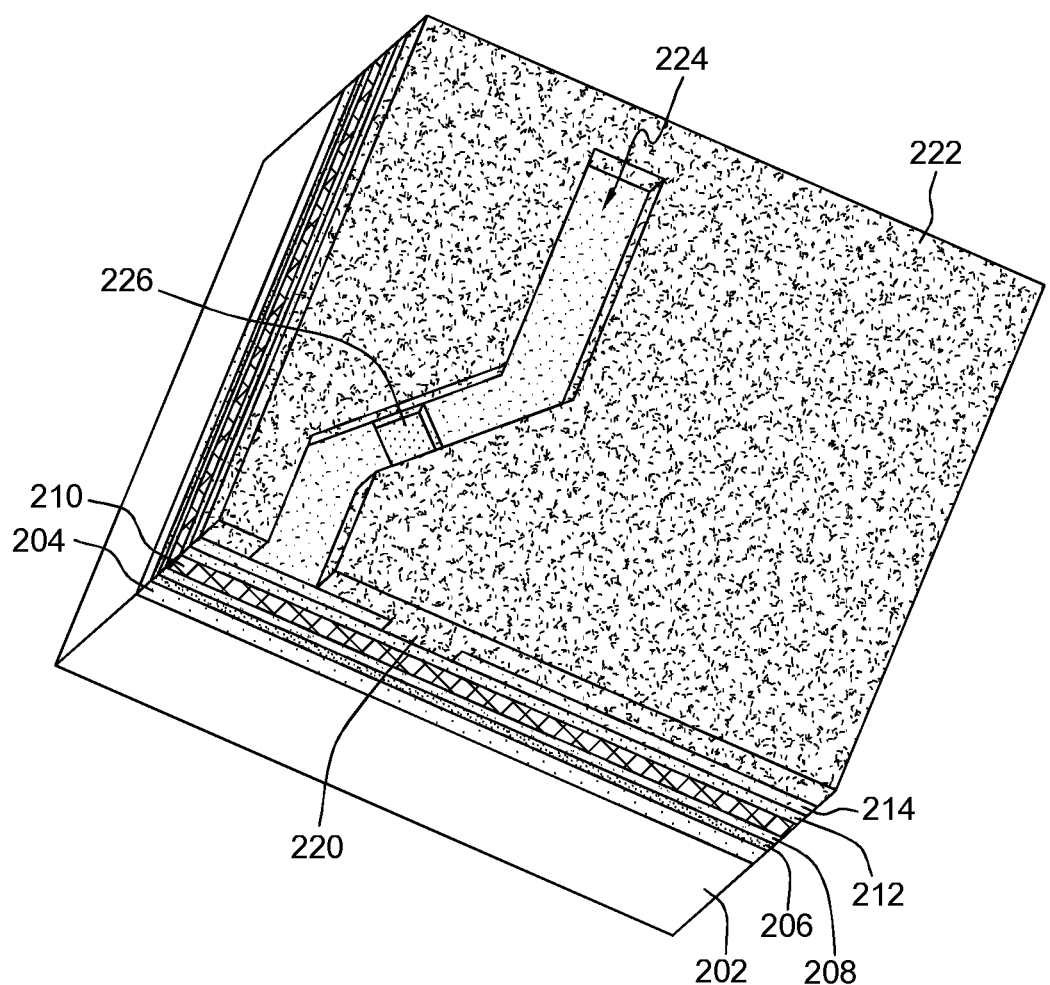
FIG. 8 depicts a three dimensional view of the semiconductor device of FIG. 7 after performing lithography to pattern at least one second source/drain via, in accordance with one or more aspects of the present invention.
Figure 9:
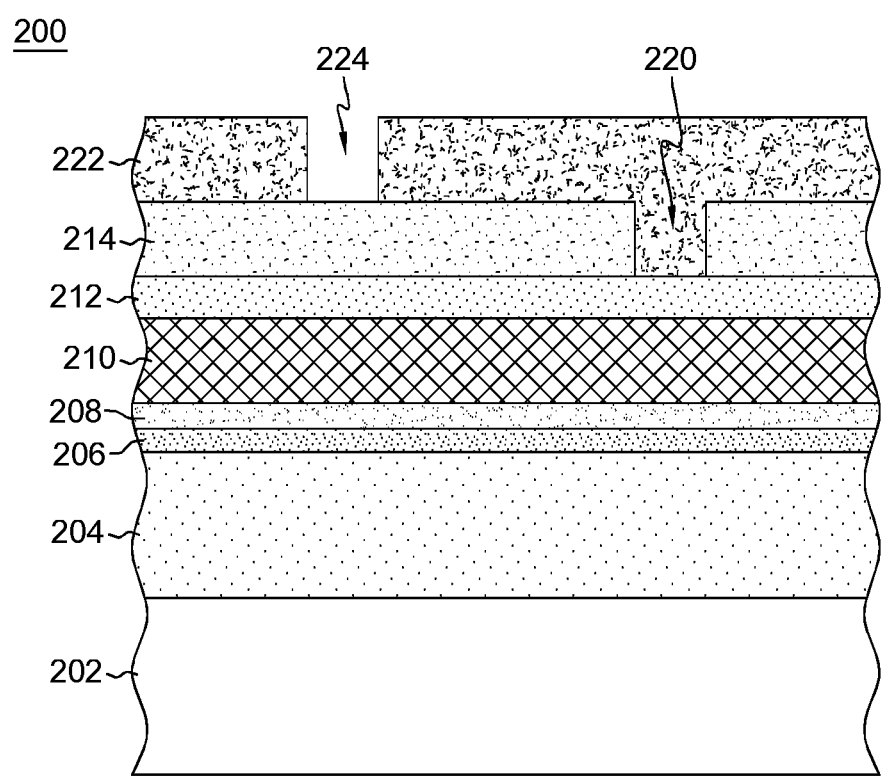
FIG. 9 depicts the cross-sectional elevation view of the semiconductor device of FIG. 8, in accordance with one or more aspects of the present invention.
Figure 10:
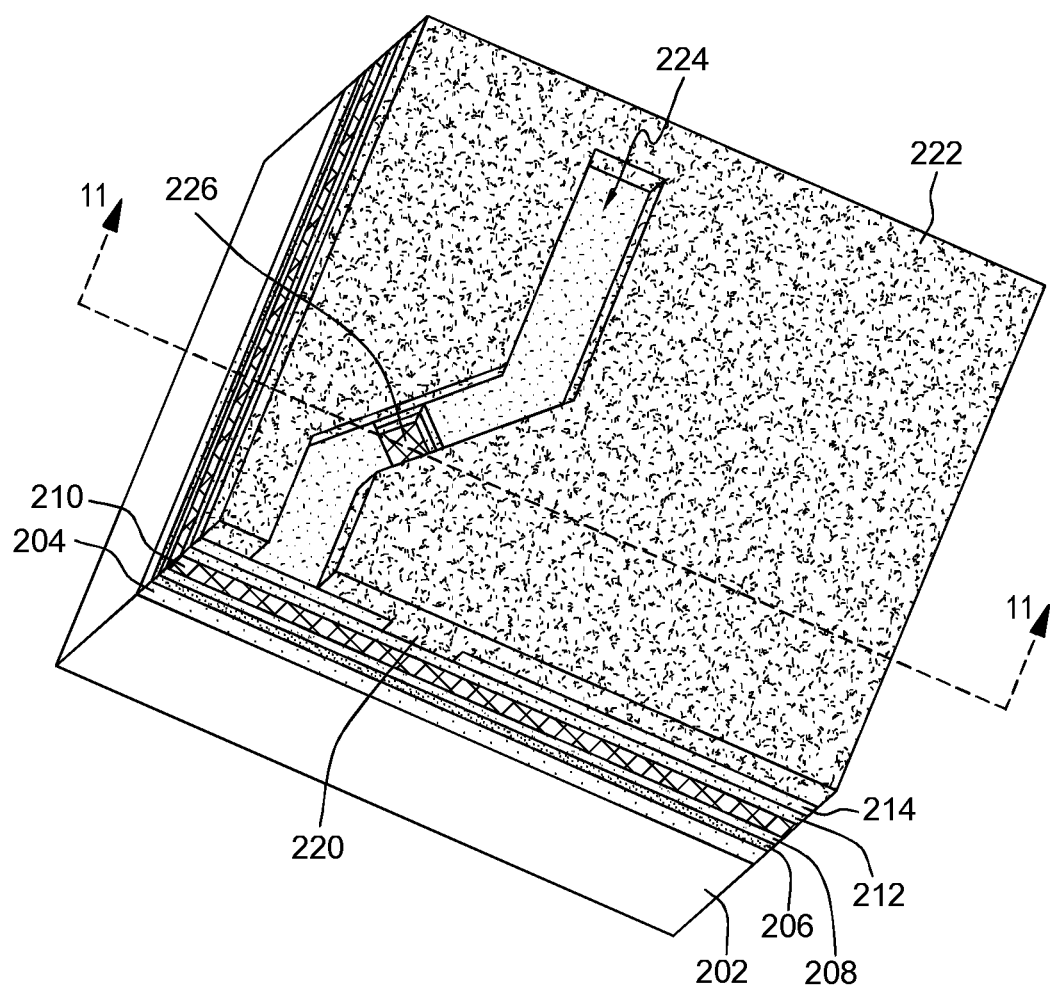
FIG. 10 depicts the three dimensional view of the semiconductor device of FIG. 9 after performing a nitride reactive ion etch, in accordance with one or more aspects of the present invention.
Figure 11:
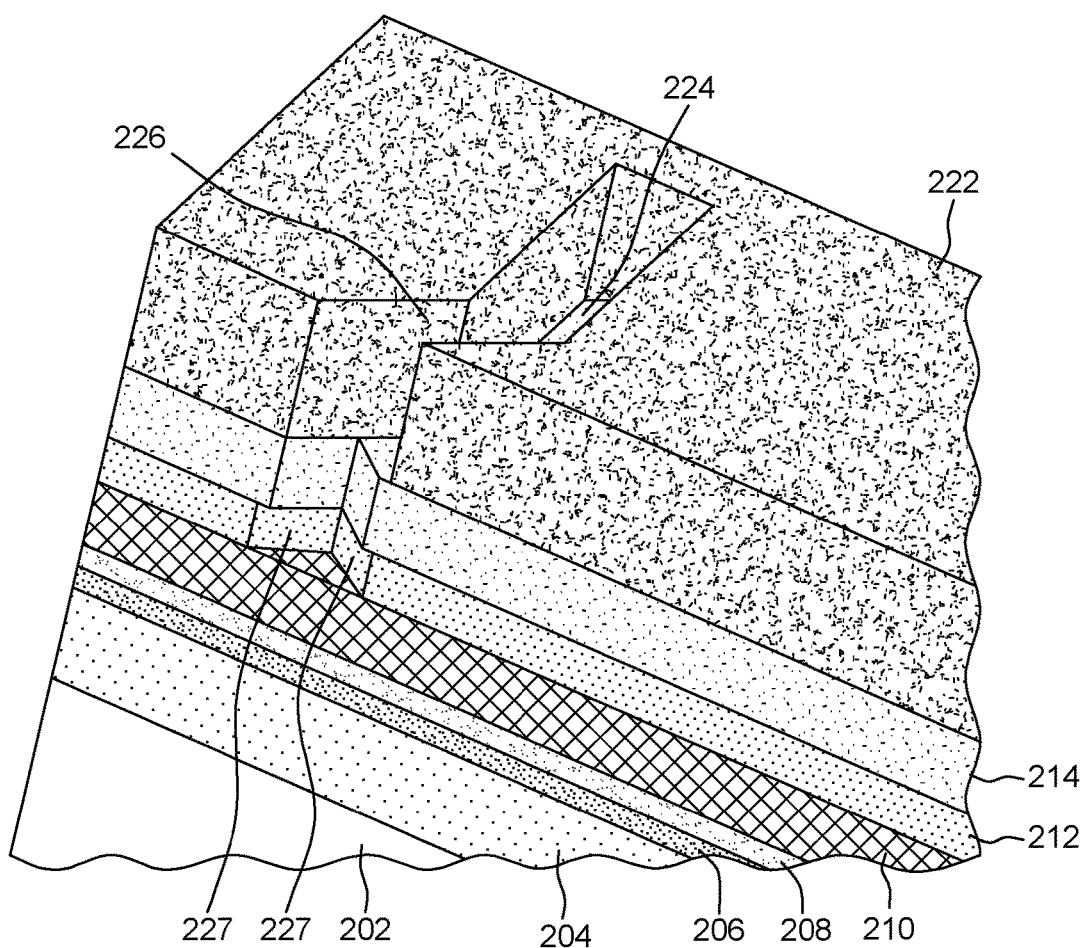
FIG. 11 depicts a portion of the three dimensional view of the semiconductor device of FIG. 10 along line 11-11 after performing a nitride wet etch to enlarge separation between the first and second via openings, in accordance with one or more aspects of the present invention.
Figure 12:
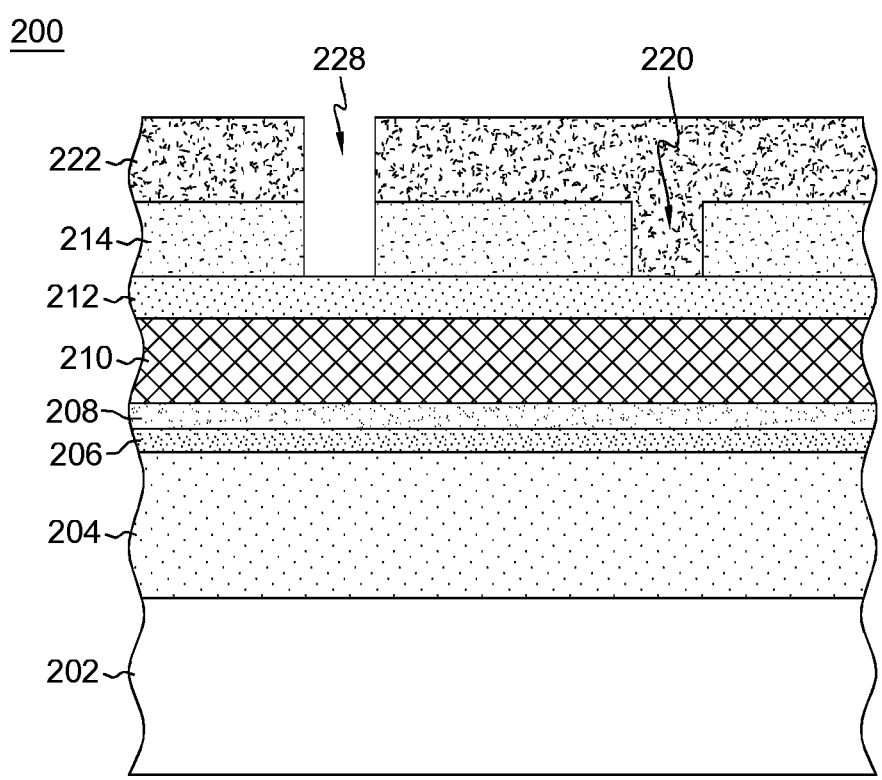
FIG. 12 depicts the cross-sectional elevation view of the semiconductor device of FIG. 10 after etching an oxide layer, in accordance with one or more aspects of the present invention.
Figure 13:
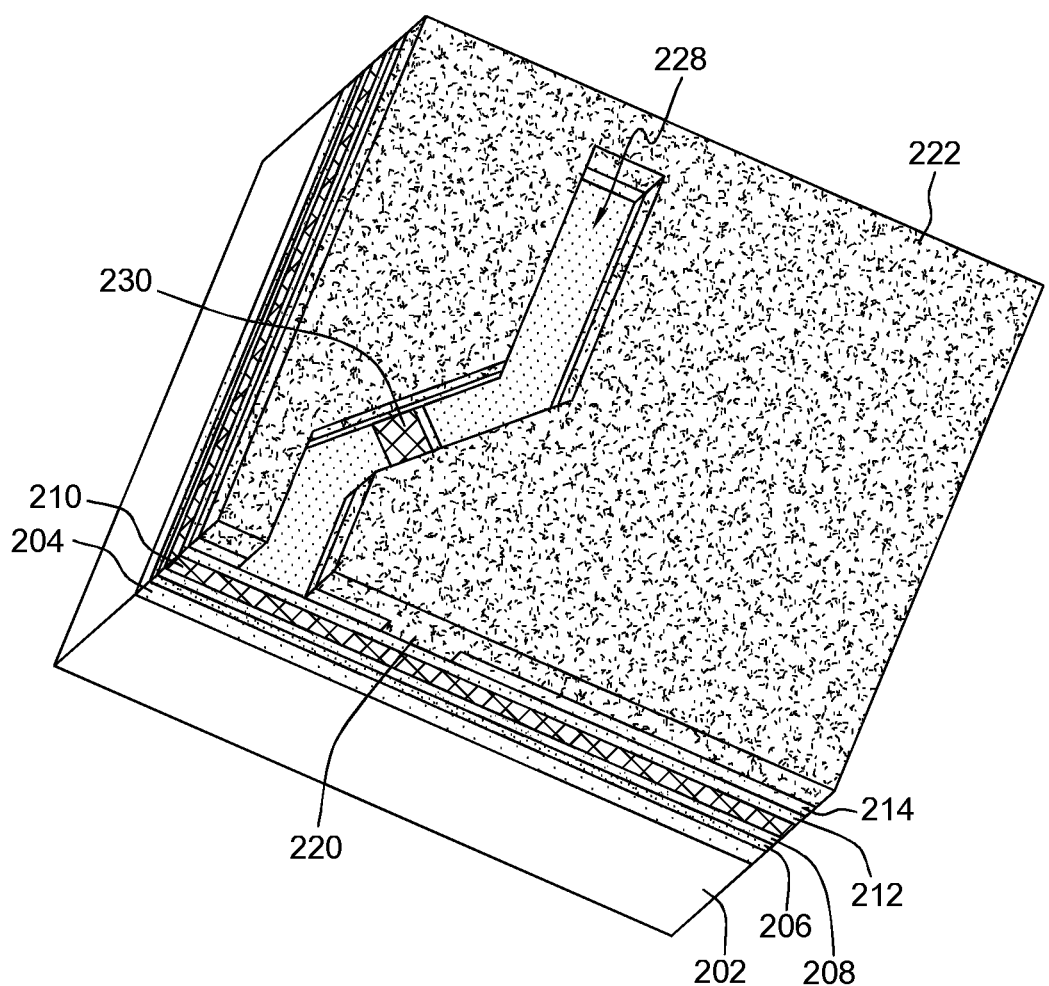
FIG. 13 depicts the three dimensional view of the semiconductor device of FIG. 12, in accordance with one or more aspects of the present invention.

Lithography may then be performed using a second mask to pattern the second lithography stack 222 to form at least one second source/drain via pattern 224, as shown in FIGS. 8 and 9. The lithography processing may also include a developing process to expose a region 226, formed where the at least one first source/drain via opening 220 overlaps the at least one second source/drain via pattern 224, as shown in FIG. 8. The overlapping region 226 may be processed into a self-aligned block area as described in greater detail below. The region 226 exposes a portion of the etch stop layer 212. Next, an etch may be performed to the device 200 to expose the polysilicon layer 210 in the overlapping region 226, as shown in FIG. 10. The etch may be, for example, a nitride reactive ion etch which is selective to oxide and the polysilicon layer 210 may be, for example, an amorphous silicon. Next, a wet etch may be performed to enlarge the separation between the at least one first source/drain via opening 220 and the at least one second source/drain via pattern 224, as shown in FIG. 11. The wet etch may be, for example, a hot phosphoric nitride wet etch which may etch the etch stop layer 212 to form recesses 227. The recesses 227 may enlarge the separation between the at least one first source/drain via opening 220 and the at least one second source/drain via pattern 224 to prevent shorts in the final source/drain contacts formed by the at least one first source/drain via opening 220 and the at least one second source/drain via pattern 224. Another etch may then be performed using the at least one second source/drain via pattern 224 to etch into the oxide layer 214 stopping on the etch stop layer 212 and forming at least one second source/drain via opening 228, as shown in FIGS. 12 and 13. The wet etch and oxide etch may form a larger overlapping region 230, as shown in FIG. 13. Next, the second lithography stack 222 may be stripped from the device 200, as shown in FIGS. 14 and 15.

Alternatively, after the nitride reactive ion etch is performed to remove the uncovered portion of the etch stop layer 212, another etch may be performed to remove a portion of the oxide layer 214 down to the etch stop layer 212 forming the at least one second source/drain via opening 228. Next, the second lithography stack 222 may be stripped from the device 200. After the second lithography stack 222 is stripped, a wet etch may be performed to enlarge the separation between the via openings 220, 228. The wet etch may be, for example, a hot phosphoric nitride wet etch that etches the etch stop layer 212 to form recesses 227.

Figure 14:
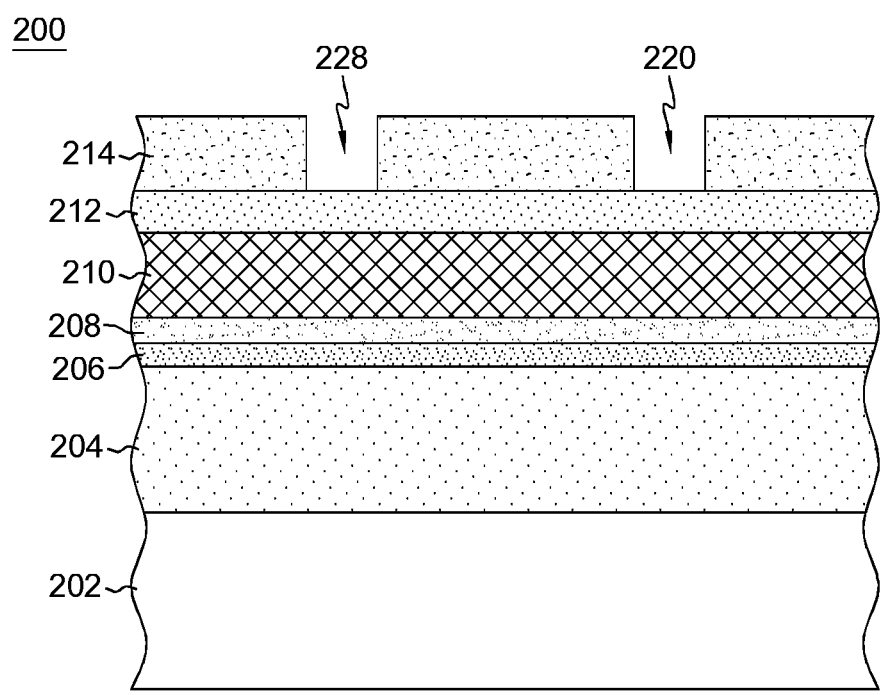
FIG. 14 depicts the cross-sectional elevation view of the semiconductor device of FIG. 12, taken along line 14-14 in FIG. 16, after stripping the second lithography stack, in accordance with one or more aspects of the present invention.
Figure 15:
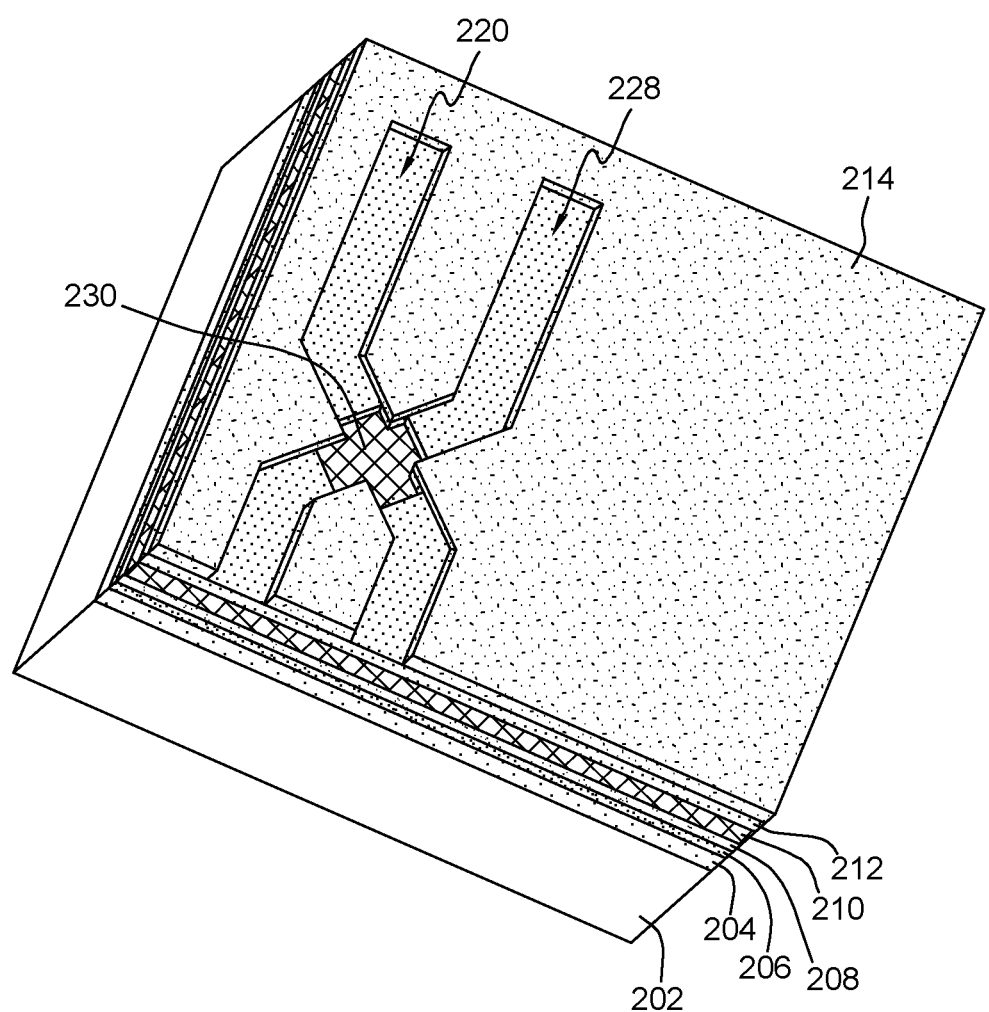
FIG. 15 depicts the three dimensional view of the semiconductor device of FIG. 14, in accordance with one or more aspects of the present invention.
Figure 16:
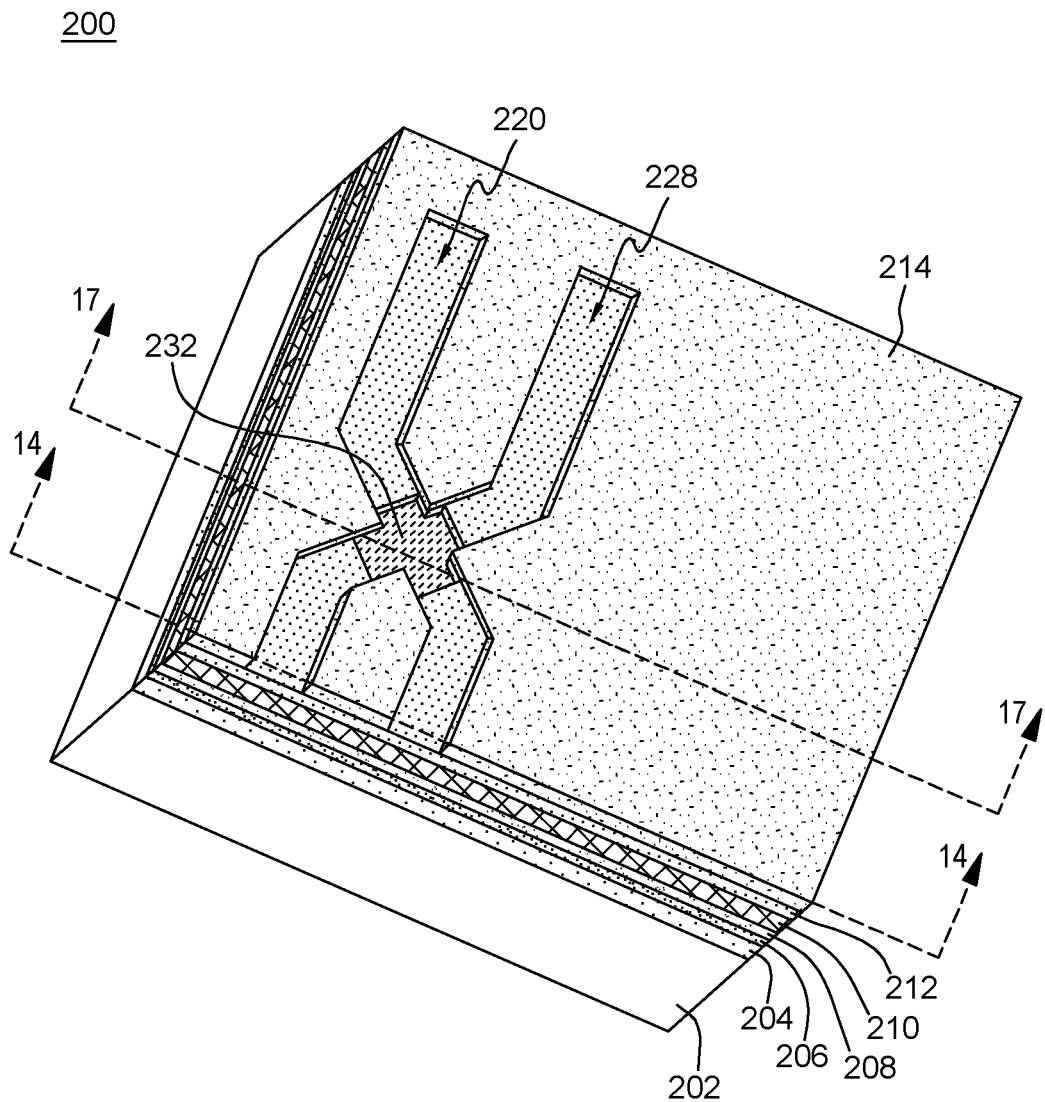
FIG. 16 depicts the three dimensional view of the semiconductor device of FIG. 15 after oxidizing the silicon, in accordance with one or more aspects of the present invention.
Figure 17:
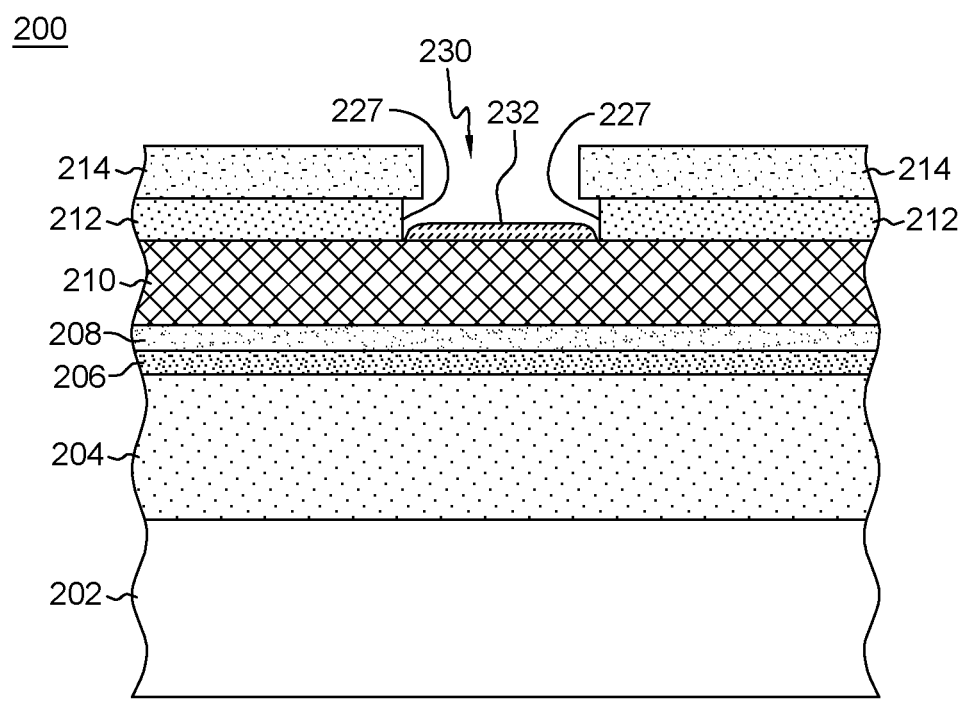
FIG. 17 depicts a cross-sectional elevation view of the semiconductor device taken along line 17-17 in FIG. 16, in accordance with one or more aspects of the present invention.
Figure 18:
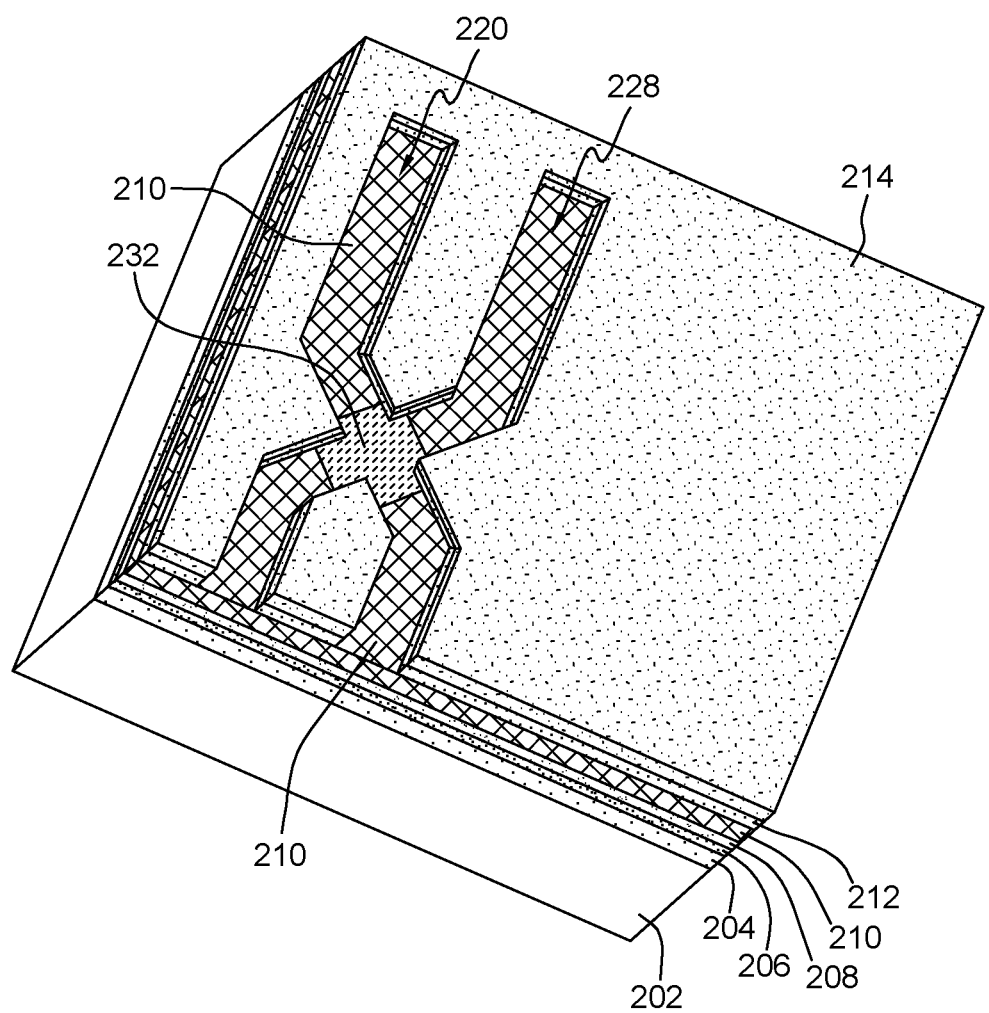
FIG. 18 depicts the three dimensional view of the semiconductor device of FIG. 16 after etching the nitride layer, in accordance with one or more aspects of the present invention.

Referring now to FIGS. 14, 16 and 17, oxidation may be performed to the device 200. The oxidation may be, for example, a silicon selective oxidation, forming a hard mask layer 232 over the overlapping region 230 to form an amorphous silicon self-aligned block, as shown in FIG. 17. The hard mask layer 232 may be, for example, an oxide layer. It is also contemplated that the hard mask layer 232 could be formed using silicidation, epitaxy, or spacer plugging as would be known by one of ordinary skill in the art. Next, another etch may be performed to remove the etch stop layer 212 from the via openings 220, 228 exposing the polysilicon layer 210, as shown in FIG. 18.

Figure 19:
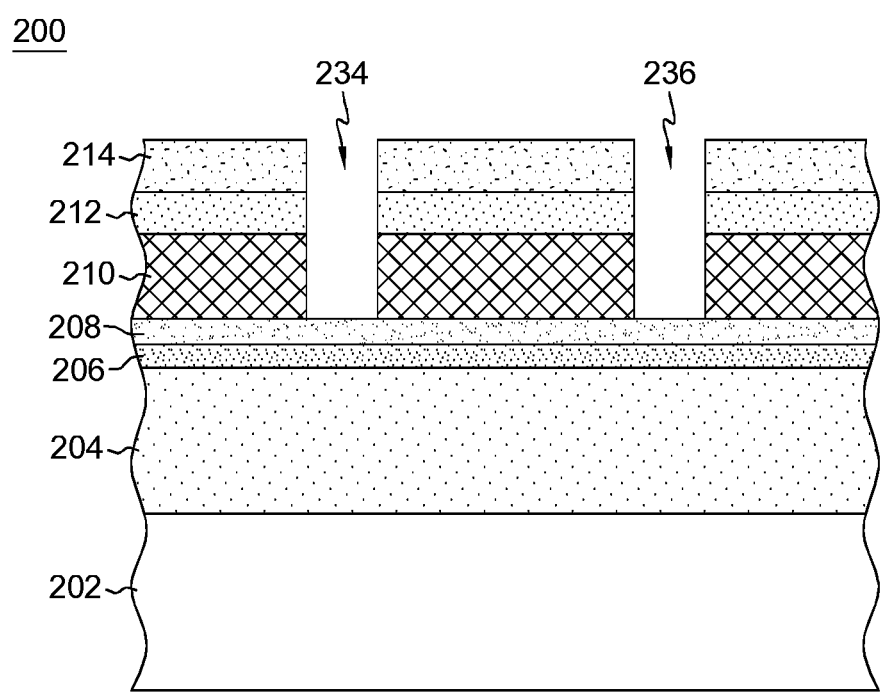
FIG. 19 depicts a cross-sectional elevational view of the semiconductor device of FIG. 18 after etching the polysilicon layer, in accordance with one or more aspects of the present invention.
Figure 20:
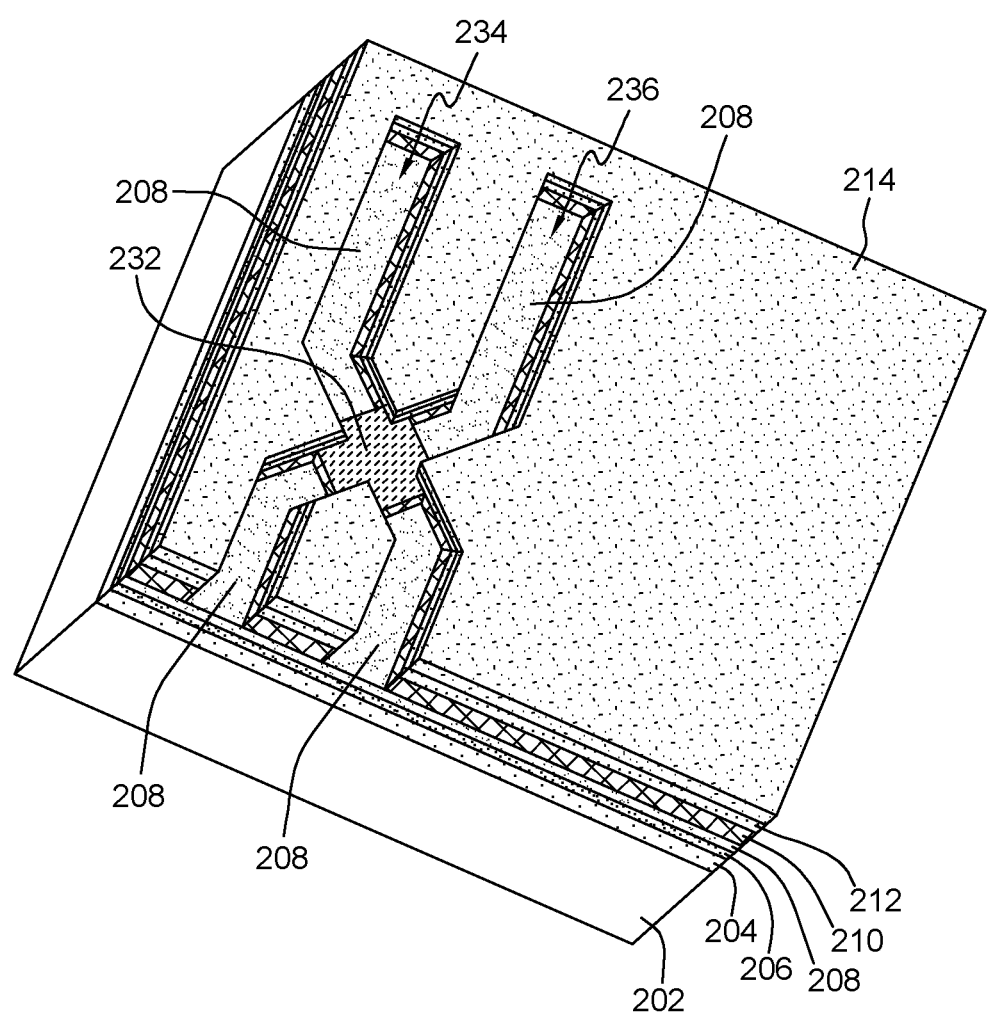
FIG. 20 depicts the three dimensional view of the semiconductor device of FIG. 19, in accordance with one or more aspects of the present invention.
Figure 21:
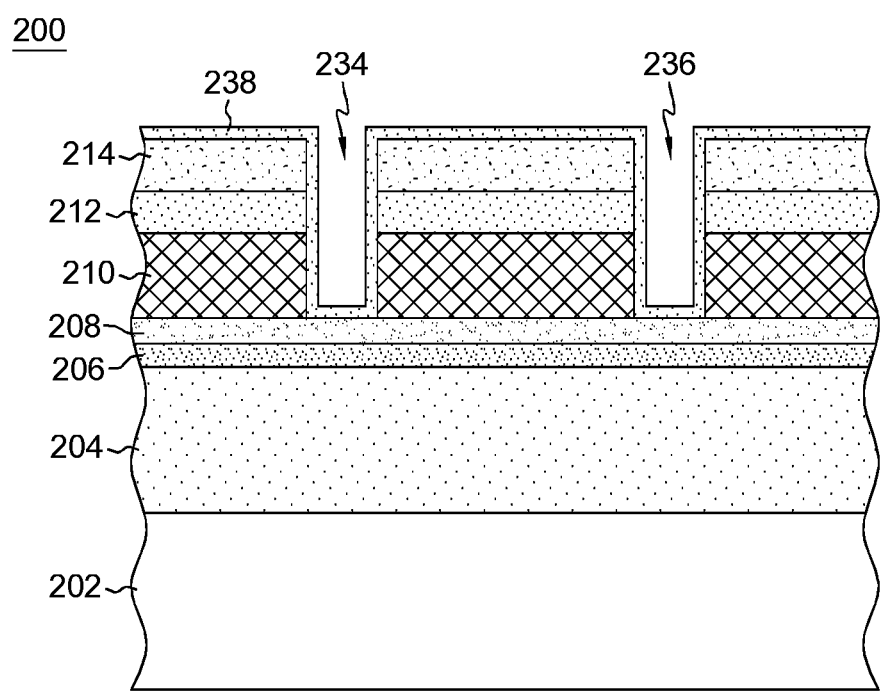
FIG. 21 depicts a cross-sectional elevational view of the semiconductor device of FIG. 19 after deposition of an oxide spacer layer, in accordance with one or more aspects of the present invention.
Figure 22:
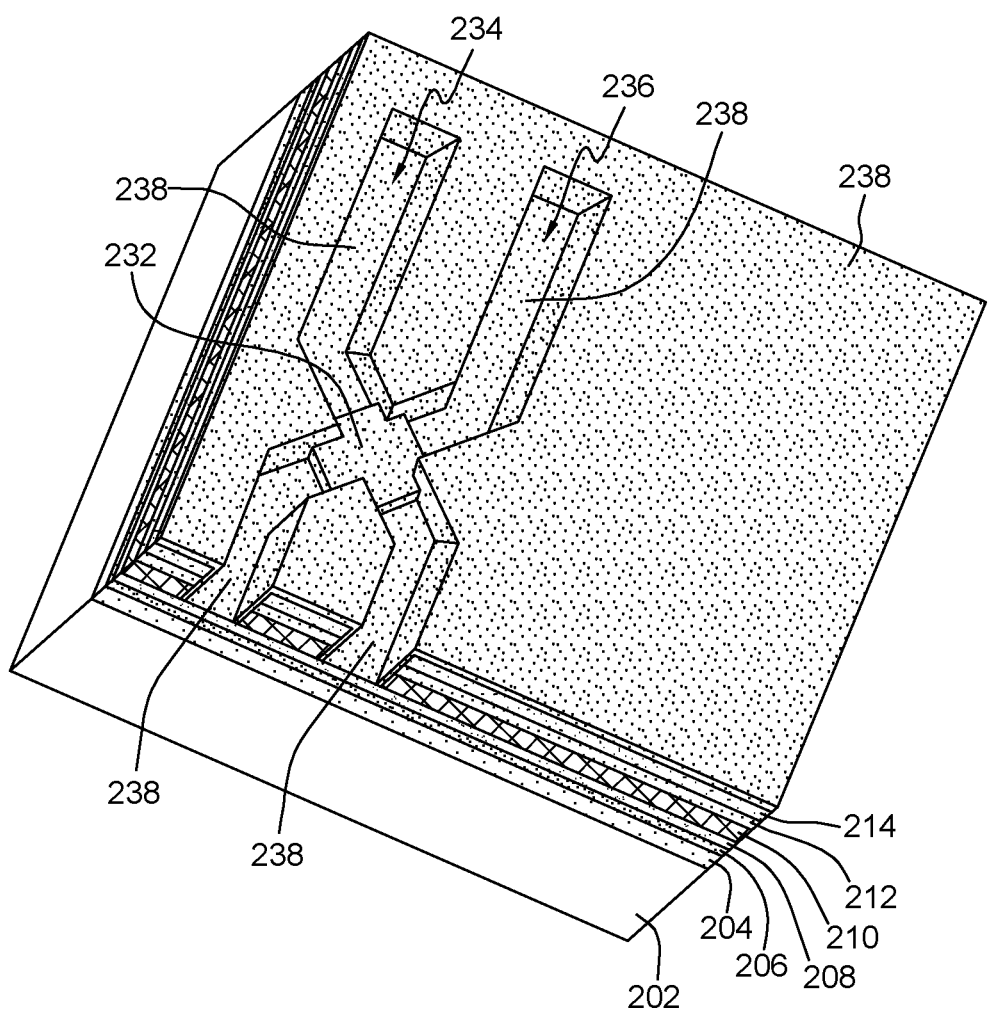
FIG. 22 depicts the three dimensional view of the semiconductor device of FIG. 21, in accordance with one or more aspects of the present invention.
Figure 23:
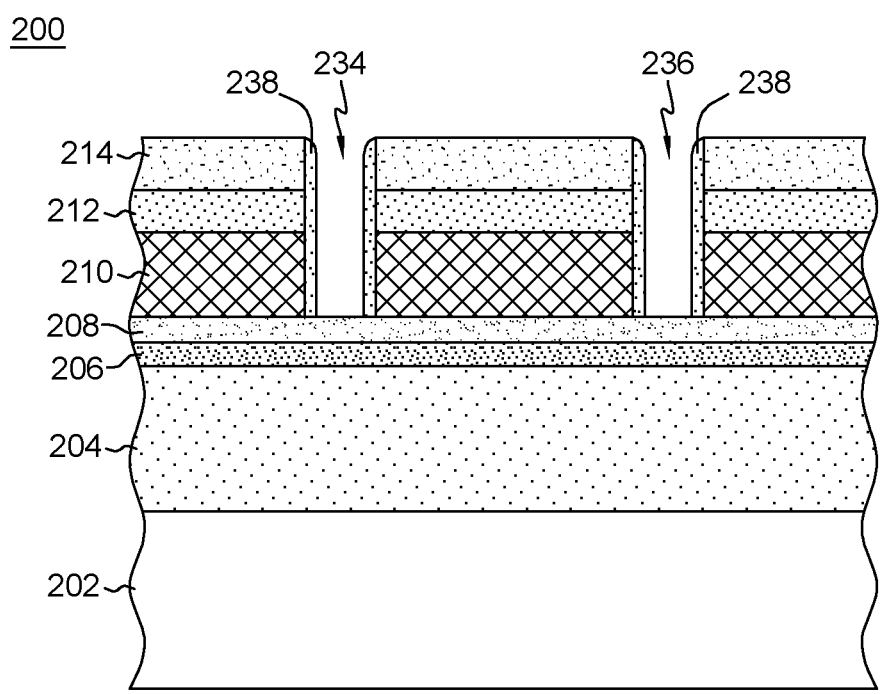
FIG. 23 depicts a cross-sectional elevational view of the semiconductor device of FIG. 21 after a controlled reactive ion etch of the spacer layer, in accordance with one or more aspects of the present invention.
Figure 24:
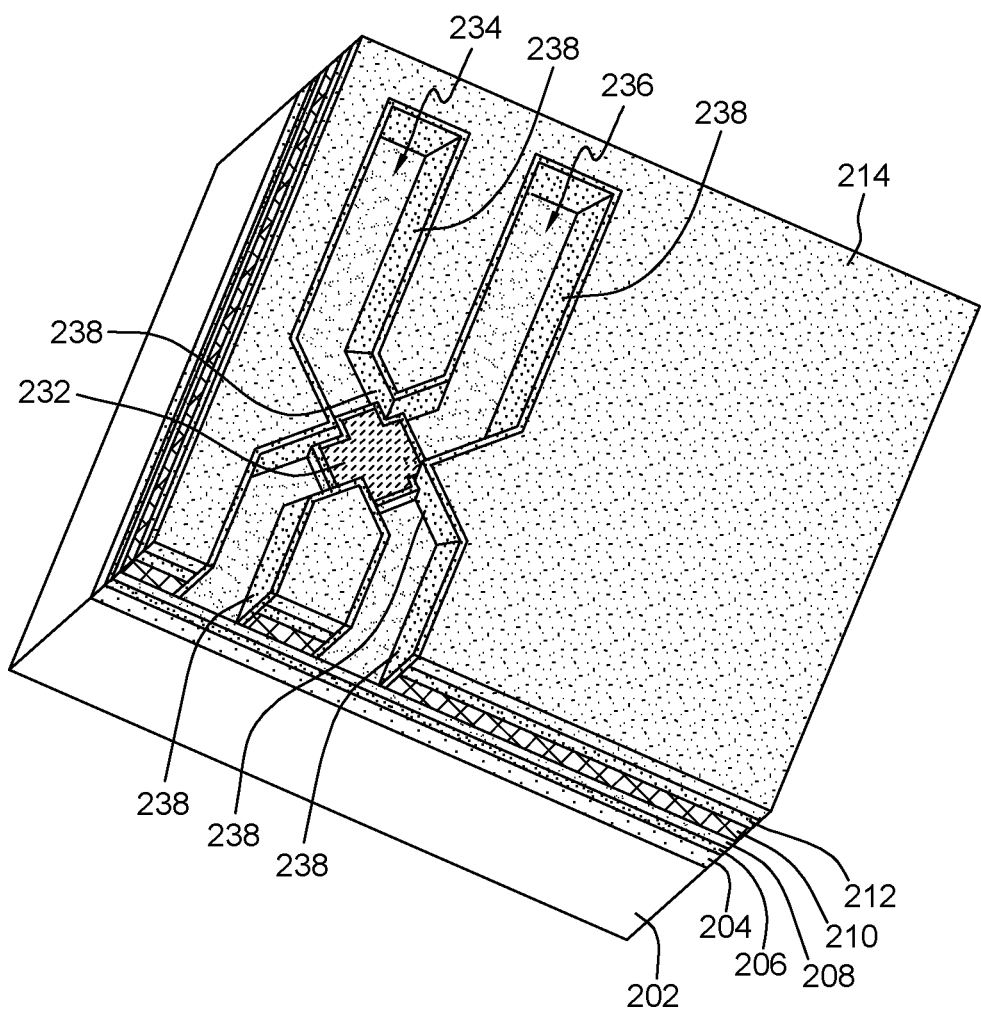
FIG. 24 depicts the three dimensional view of the semiconductor device of FIG. 23, in accordance with one or more aspects of the present invention.

As shown in FIGS. 19 and 20, another etch may be performed to the device 200 removing the portion of the polysilicon layer 210 in the via openings 220, 228 to form deeper via openings 234, 236 extending through the oxide layer 214, etch stop layer 212, and polysilicon layer 210 down to the second hard mask layer 208. A spacer layer 238 may then be deposited over the device 200 including into the at least one first via opening 234 and the at least one second via opening 236, as shown in FIGS. 21 and 22. The spacer layer 238 may be deposited by, for example, atomic layer deposition (ALD) and may be, for example, a silicon dioxide ($SiO_2$), silicon nitride (SiN), silicon oxynitride (SiON), titanium dioxide ($TiO_2$), amorphous silicon, or the like. Next, an etch may be performed to remove the horizontal portions of the spacer layer 238 forming sidewall spacers 238, as shown in FIGS. 23 and 24. The etch may be, for example, a reactive ion etch (RIE), such as, a controlled RIE.

Figure 25:
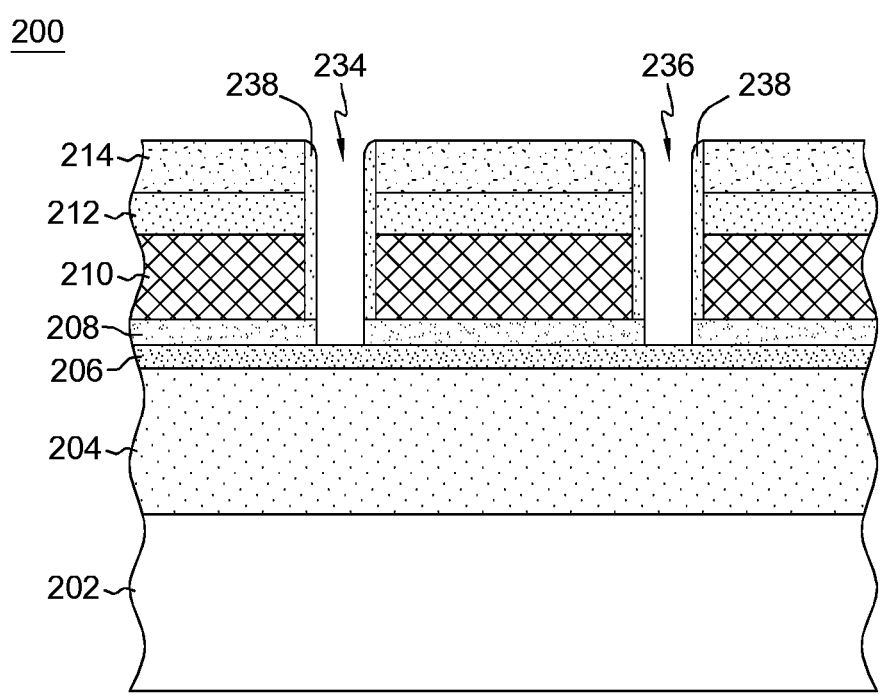
FIG. 25 depicts a cross-sectional elevational view of the semiconductor device of FIG. 23 after performing another reactive ion etch to punch the second hard mask layer, in accordance with one or more aspects of the present invention.
Figure 26:
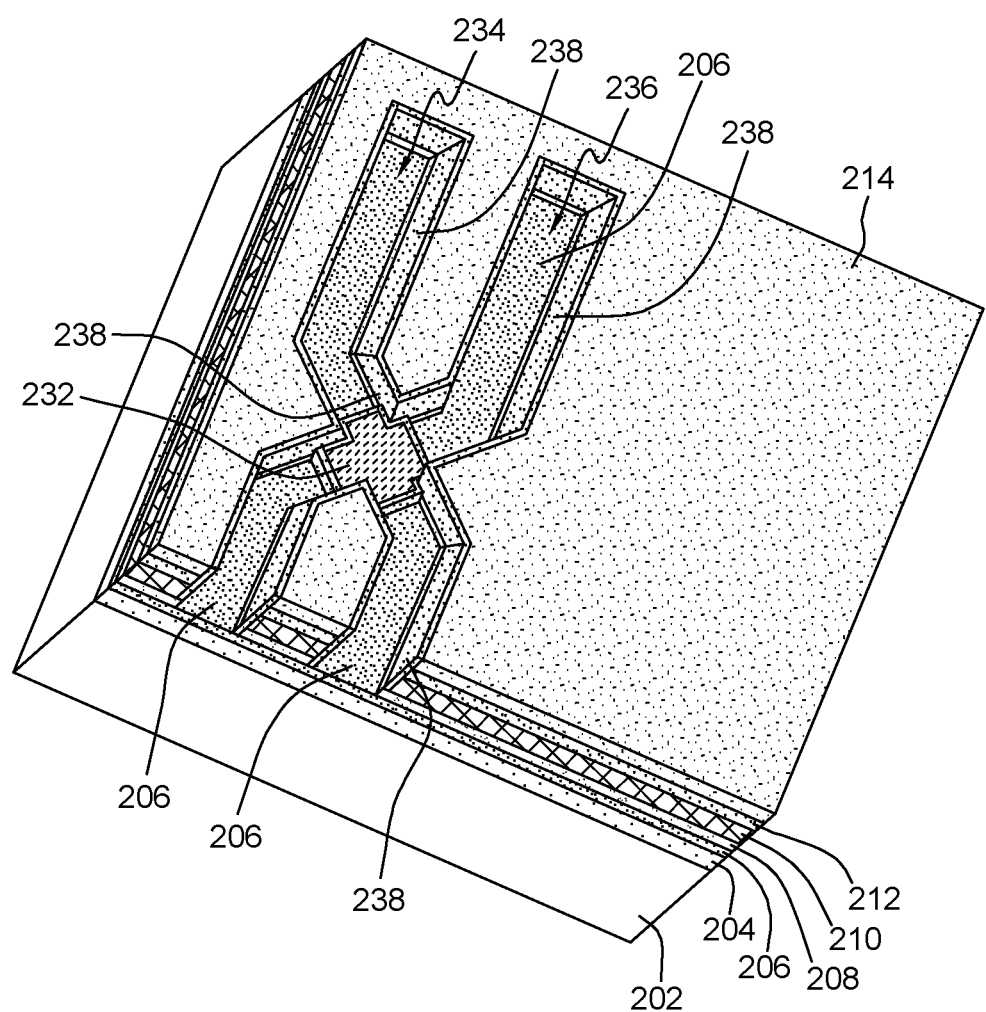
FIG. 26 depicts the three dimensional view of the semiconductor device of FIG. 25, in accordance with one or more aspects of the present invention.
Figure 27:
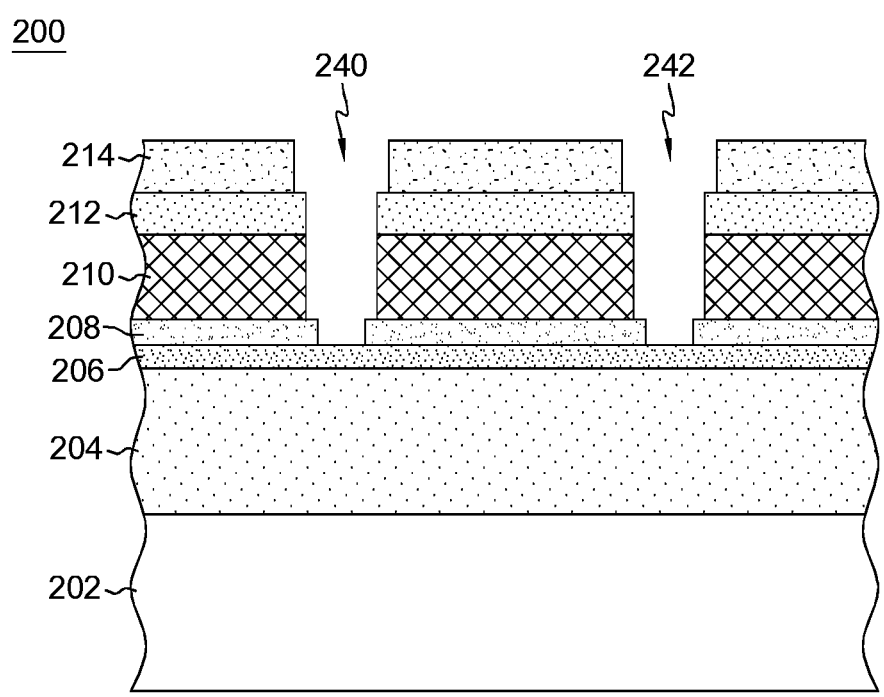
FIG. 27 depicts a cross-sectional elevational view of the semiconductor device of FIG. 25 after performing an isotropic etch to remove the spacer layer, in accordance with one or more aspects of the present invention.
Figure 28:
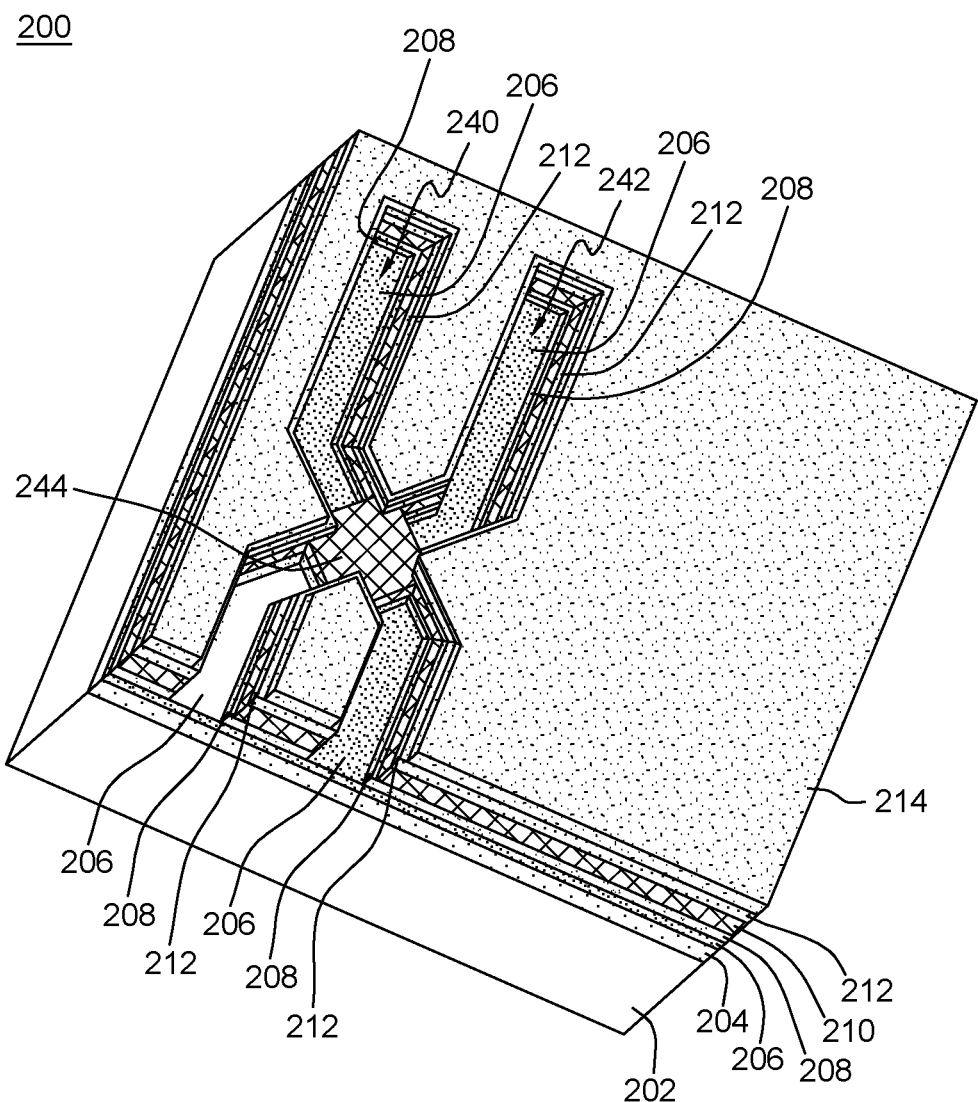
FIG. 28 depicts the three dimensional view of the semiconductor device of FIG. 27, in accordance with one or more aspects of the present invention.
Figure 29:
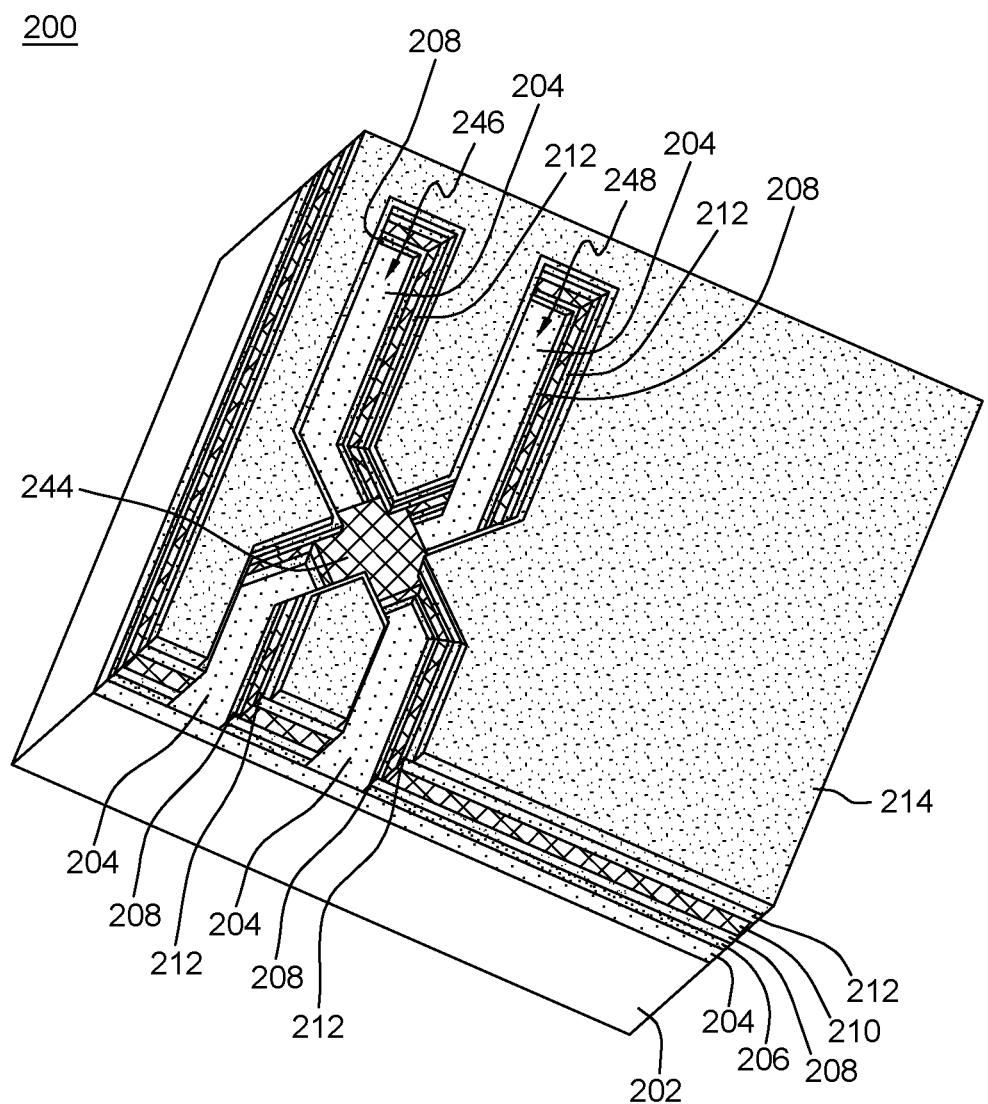
FIG. 29 depicts a three dimensional view of the semiconductor device of FIG. 28 after performing another reactive ion etch to punch the barrier layer, in accordance with one or more aspects of the present invention.

After the sidewall spacers 238 are formed, hard mask opening processing may be performed as shown in FIGS. 25-29. First, as shown in FIGS. 25 and 26, a dry etch and/or short etch may be performed to punch or remove the second hard mask layer 208 in the at least one first via opening 234 and the at least one second via opening 236. An isotropic etch may then be performed to remove the sidewall spacers 238 and form via openings 240, 242, as shown in FIGS. 27 and 28. The isotropic etch may be, for example, a silicon dioxide ($SiO_2$) etch or the $SiCoNi^{198}$ etch. The isotropic etch may also etch a portion of the oxide layer 214 in the at least one first via opening 240 and the at least one second via opening 242. Further, the isotropic etch may remove the hard mask layer 232 exposing a self-aligned polysilicon block 244. Then, a dry etch or RIE short etch or punch may be performed to punch the first hard mask layer 206 and form the at least one first via opening 246 and the at least one second via opening 248, as shown in FIG. 29. The RIE short etch may be, for example, a nitride etch that is selective with respect to oxide.

Figure 30:
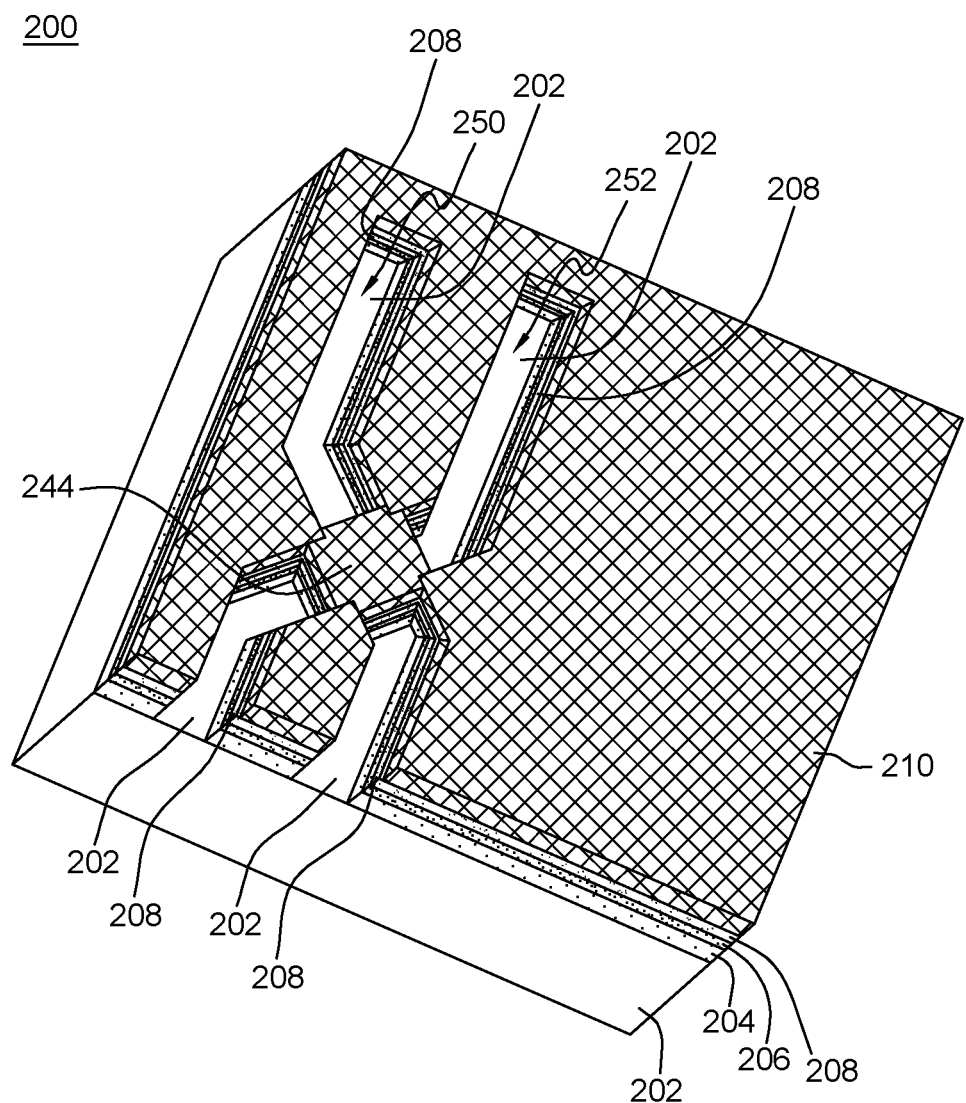
FIG. 30 depicts a three dimensional view of the semiconductor device of FIG. 29 after etching the interlayer dielectric layer to form the source/drain contact trenches, in accordance with one or more aspects of the present invention.
Figure 31:
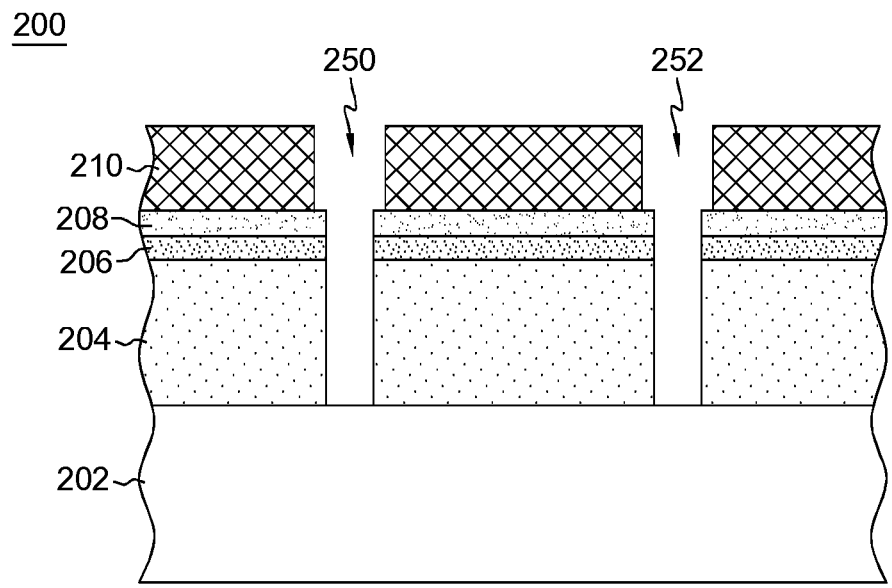
FIG. 31 depicts the cross-sectional elevational view of the semiconductor device of FIG. 30, in accordance with one or more aspects of the present invention.
Figure 32:
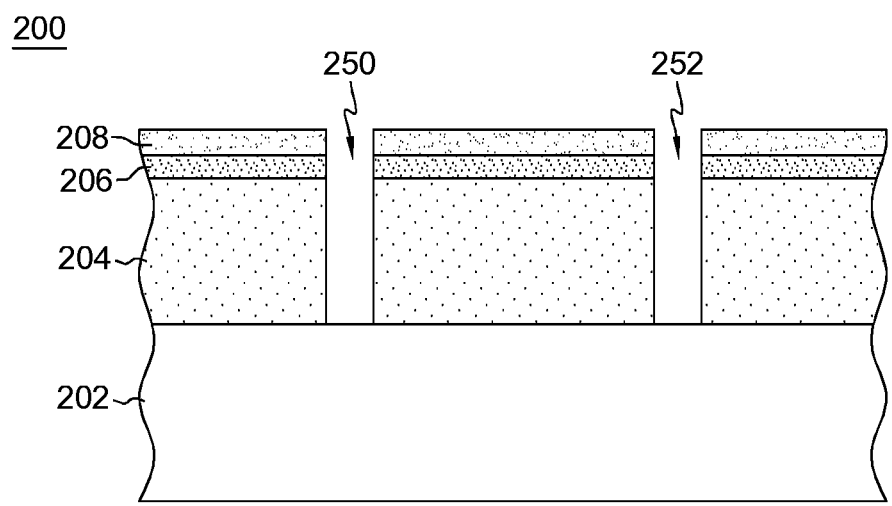
FIG. 32 depicts a cross-sectional elevational view of the semiconductor device of FIG. 31 after etching to remove the polysilicon layer, in accordance with one or more aspects of the present invention.
Figure 33:
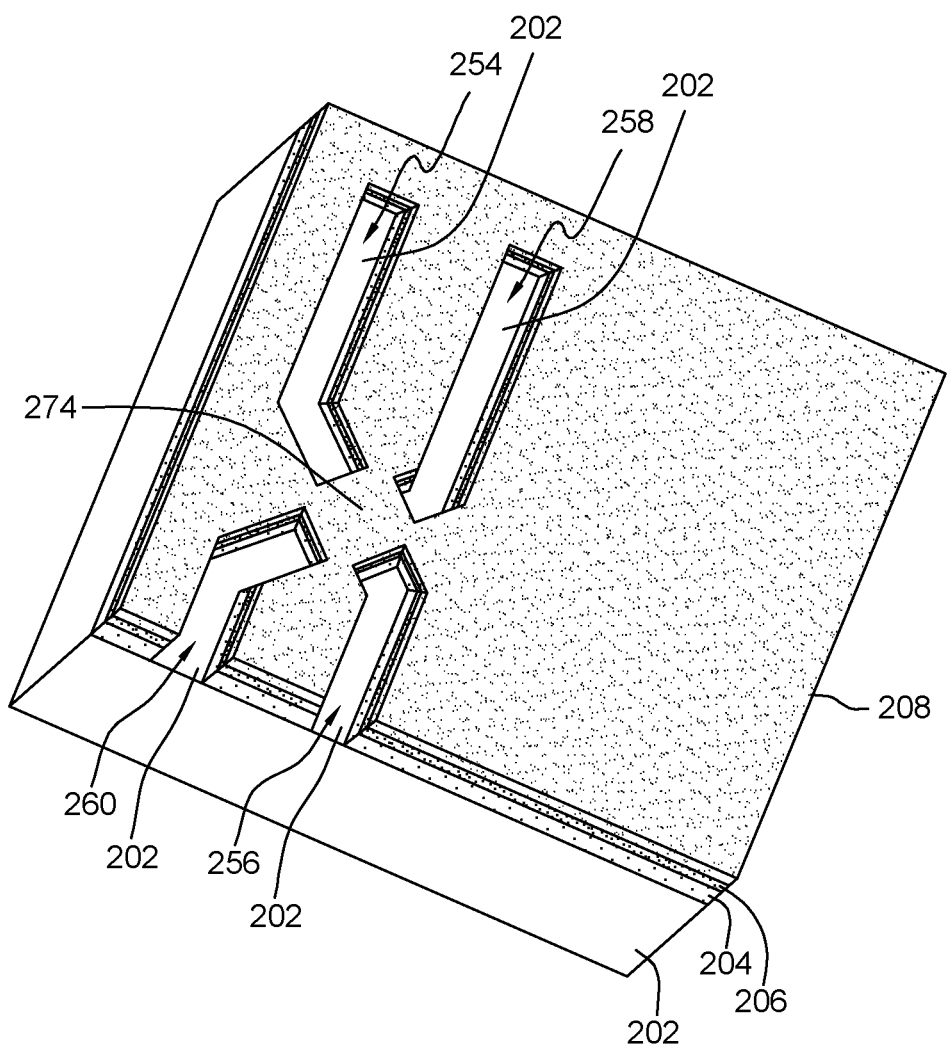
FIG. 33 depicts a three dimensional view of the semiconductor device of FIG. 32, in accordance with one or more aspects of the present invention.

Next, at least one etch may be performed to form the source/drain contact trenches, as shown in FIGS. 30-33. Referring now to FIGS. 30 and 31, an etch may be performed to remove the ILD layer 204 in the at least one first via opening 246 and the at least one second via opening 248 to form at least one first source/drain contact trench 250 and at least one second source/drain contact trench 252. The etch may be, for example, one that is selective to amorphous silicon. Next, as shown in FIGS. 32 and 33, another etch may be performed to remove the polysilicon layer 210 forming at least one first source/drain contact trench 254, 256 and at least one second source/drain contact trench 258, 260 each of the contact trenches 254, 256, 258, 260 being separated by a self-aligned block 274.

Figure 34:
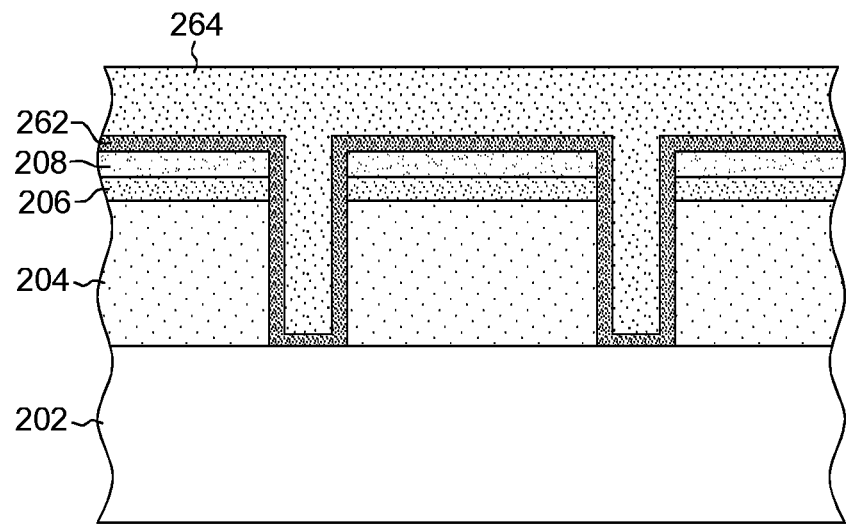
FIG. 34 depicts a cross-sectional elevational view of the semiconductor device of FIG. 33 after depositing a barrier layer and performing a metal fill process to fill the contacts, in accordance with one or more aspects of the present invention.
Figure 35:
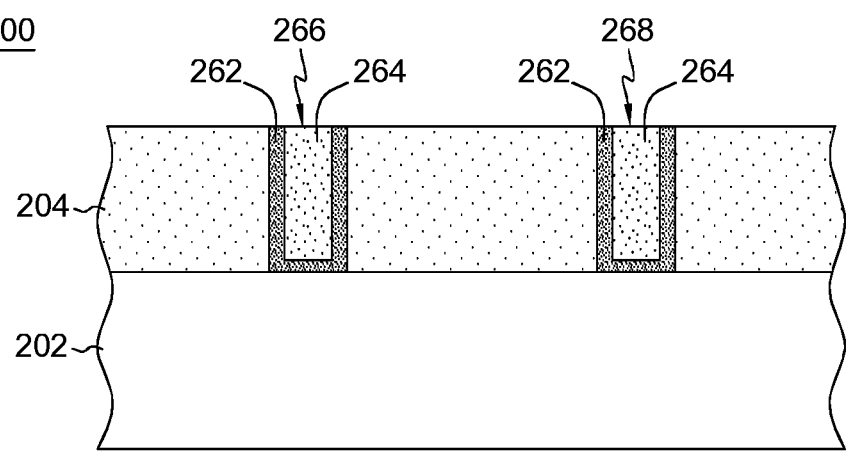
FIG. 35 depicts a cross-sectional elevational view of the semiconductor device of FIG. 34 after performing a planarization to remove the excess metal layer, excess barrier layer, and the hard mask bi-layer to form the source/drain contacts, in accordance with one or more aspects of the present invention.
Figure 36:
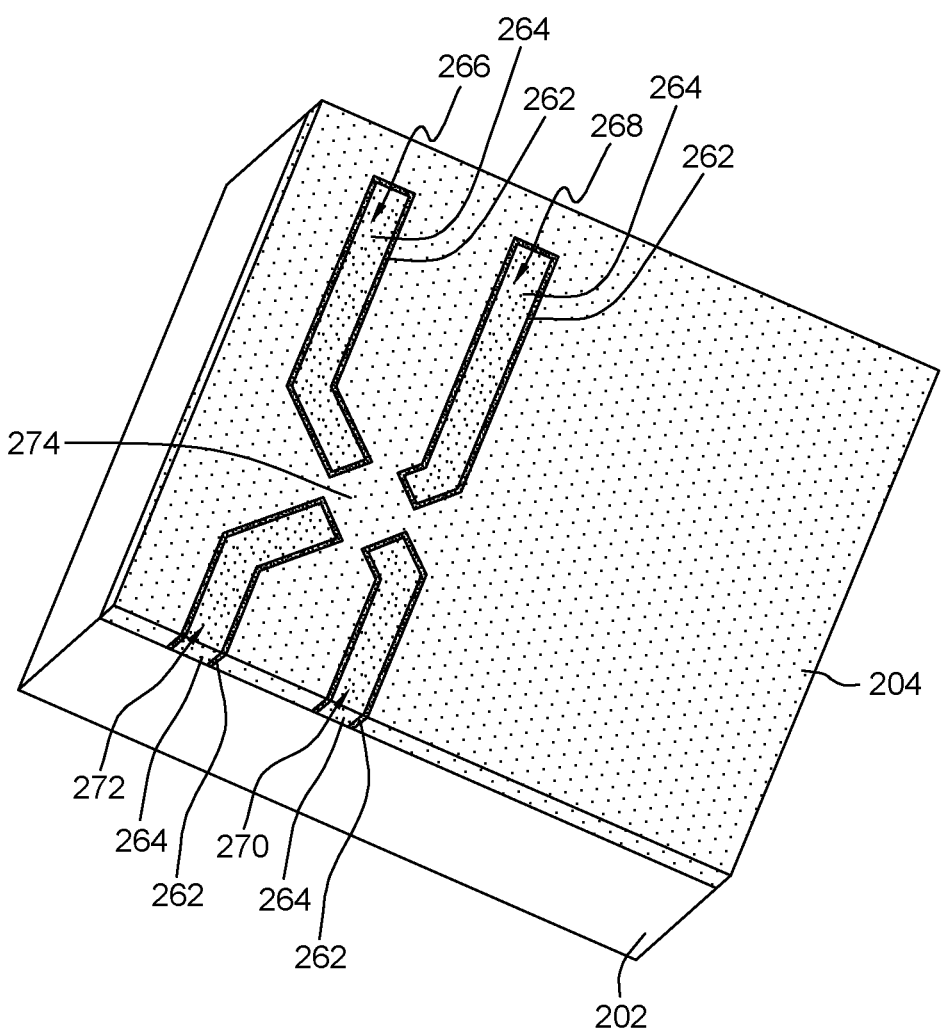
FIG. 36 depicts the three dimensional view of the semiconductor device of FIG. 35, in accordance with one or more aspects of the present invention.

Finally, a metallization process may be performed to form the source/drain contacts, as shown in FIGS. 34-36. The metallization process may include, for example, depositing a barrier layer 262 over the device 200 and into the contact trenches 254, 256, 258, 260, as shown in FIG. 34. With continued reference to FIG. 34, the metallization process may also include, for example, performing a metal fill over the device 200 to fill the contact trenches 254, 256, 258, 260 with a metal layer 264. Next, as shown in FIGS. 35 and 36, a planarization may be performed to remove the excess metal layer 264, excess barrier layer 262, the second hard mask layer 208 and the first hard mask layer 206 to form at least one first source/drain contact 266, 270 and at least one second source/drain contact 268, 272. The planarization may be, for example, a chemical mechanical planarization (CMP) with over etch. As illustrated in FIG. 36, each of the contacts 266, 268, 270, 272 may be spaced apart providing an electric isolation between each of the contacts 266, 268, 270, 272.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. A method comprising:
 obtaining an intermediate semiconductor device;
 performing a first lithography to pattern a first shape for forming at least one first via opening;
 performing a second lithography to pattern a second shape for forming at least one second via opening, wherein a portion of the second shape overlaps a portion of the first shape;
 processing the first shape and the second shape to form an isolation region at the overlap separating the at least one first via opening and the at least one second via opening; and
 forming four conductive regions in the at least one first and at least one second via openings.

2. The method of claim 1, wherein the intermediate semiconductor device comprises:
a substrate;
an interlayer dielectric layer on the substrate;
a hard mask bi-layer on the interlayer dielectric layer;
a polysilicon layer on the hard mask bi-layer;
an etch stop layer on the polysilicon layer;
an oxide layer on the etch stop layer; and
a first lithography stack on the oxide layer.

3. The method of claim 2, wherein performing the first lithography to pattern the first shape comprises:
using a first mask to form the at least one first via opening, wherein using the first mask to form the at least one first via opening comprises:
exposing the first mask to form at least one first via pattern in the first lithography stack;
etching the oxide layer to form the at least one first via opening; and
stripping the first lithography stack from the intermediate semiconductor device.

4. The method of claim 1, wherein the intermediate semiconductor device comprises:
a substrate;
an interlayer dielectric layer on the substrate;
a hard mask bi-layer on the interlayer dielectric layer;
a polysilicon layer on the hard mask bi-layer;
an etch stop layer on the polysilicon layer;
an oxide layer on the etch stop layer; and
a second lithography stack on the oxide layer.

5. The method of claim 4, wherein performing a second lithography to pattern a second shape overlapping a portion of the first shape comprises:
performing a second lithography using a second mask to form the at least one second via opening, wherein the at least one second via opening overlaps at least one first via opening, wherein performing the second lithography using the second mask to form the at least one second via opening comprises:
exposing the second mask to form at least one second via pattern in the second lithography stack;
etching the oxide layer to form the at least one second via opening; and
stripping the second lithography stack from the intermediate semiconductor device.

6. The method of claim 5, wherein performing the second lithography using the second mask to form the at least one second via opening further comprises:
performing a developing process to expose a self-aligned block where the at least one first via opening overlaps the at least one second via pattern;
etching the intermediate semiconductor device to expose the polysilicon layer of the self-aligned block; and
performing a wet etch to enlarge the separation between the at least one first via opening and the at least one second via pattern to form recesses in the etch stop layer.

7. The method of claim 6, wherein the wet etch to form the recesses is a hot phosphoric nitride wet etch.

8. The method of claim 7, wherein forming four conductive regions separated by the isolation region comprises:
forming at least four contacts from the at least one first via opening and the at least one second via opening, wherein forming the at least four contacts comprises:
performing an oxidation to form a hard mask layer on the self-aligned block;
performing a first etch to remove a portion of the etch stop layer and expose a portion the polysilicon layer in the at least one first via opening and the at least one second via opening; and
performing a second etch to remove a portion of the polysilicon layer and expose a portion of the hard mask bi-layer.

9. The method of claim 8, wherein forming the at least four contacts from the at least one first via opening and the at least one second via opening further comprises:
depositing a spacer layer over the intermediate semiconductor device; and
etching the spacer layer to form sidewall spacers in the at least one first via opening and the at least one second via opening.

10. The method of claim 9, wherein forming the at least four contacts from the at least one first via opening and the at least one second via opening further comprises:
performing a dry etch to remove a portion of a second hard mask layer of the hard mask bi-layer in the at least one first via opening and the at least one second via opening;
performing an isotropic etch to remove the sidewall spacers in the at least one first via opening and the at least one second via opening and to remove the hard mask layer on the self-aligned block to expose a self-aligned polysilicon block; and
performing an etch to remove a portion of the first hard mask layer of the hard mask bi-layer in the at least one first via opening and the at least one second via opening.

11. The method of claim 10, wherein forming the at least four contacts from the at least one first via opening and the at least one second via opening further comprises:
performing an etch to remove a portion of the interlayer dielectric layer in the at least one first via opening and the at least one second via opening to form at least one first contact trench and at least one second contact trench; and
performing an etch to remove the polysilicon layer from the intermediate semiconductor device.

12. The method of claim 11, wherein forming the at least four contacts from the at least one first via opening and the at least one second via opening further comprises:
depositing a barrier layer over the intermediate semiconductor device and into the at least one first contact trench and at least one second contact trench;
performing a metal fill process to deposit a metal layer on the intermediate semiconductor device and into the at least one first contact trench and at least one second contact trench; and
performing planarization to remove excess metal layer, excess barrier layer, and the hard mask bi-layer to form at least two first contacts and at least two second contacts.

13. The method of claim 1, wherein the isolation region forms an electrical separation between the four conductive regions, and wherein ends of the at least one first via opening are positioned adjacent to ends of the at least one second via opening and the isolation region is positioned to separate the ends of the at least one first via opening from the ends of the at least one second via opening.

* * * * *